(12) United States Patent
Chaudhry et al.

(10) Patent No.: US 7,491,610 B2
(45) Date of Patent: Feb. 17, 2009

(54) FABRICATION METHOD

(75) Inventors: Samir Chaudhry, Irvine, CA (US); Paul Arthur Layman, Ontario (CA); John Russell McMacken, Summerfield, NC (US); J. Ross Thomson, Clermont, FL (US); Jack Qingsheng Zhao, Plano, TX (US)

(73) Assignee: Agere Systems Inc., Allentown, PA (US)

( * ) Notice: Subject to any disclaimer, the term of this patent is extended or adjusted under 35 U.S.C. 154(b) by 55 days.

(21) Appl. No.: 11/809,873

(22) Filed: Jun. 1, 2007

(65) Prior Publication Data

US 2007/0238243 A1    Oct. 11, 2007

Related U.S. Application Data

(60) Division of application No. 10/819,253, filed on Apr. 5, 2004, now Pat. No. 7,242,056, which is a continuation of application No. 09/956,381, filed on Sep. 18, 2001, now abandoned.

(51) Int. Cl.
*H01L 21/8232* (2006.01)

(52) U.S. Cl. .................. 438/269; 438/268; 438/239; 257/E21.41

(58) Field of Classification Search .............. 438/268, 438/269, 239; 257/E21.41, 329, 330, 334
See application file for complete search history.

(56) References Cited

U.S. PATENT DOCUMENTS

| 4,366,495 | A | 12/1982 | Goodman et al. |
|---|---|---|---|
| 4,455,565 | A | 6/1984 | Goodman et al. |
| 4,587,713 | A | 5/1986 | Goodman et al. |
| 4,683,643 | A | 8/1987 | Nakajima et al. |
| 4,786,953 | A | 11/1988 | Morie et al. |
| 4,837,606 | A | 6/1989 | Goodman et al. |
| 5,006,910 | A | 4/1991 | Taguchi |

(Continued)

FOREIGN PATENT DOCUMENTS

EP    1059670    12/2000

(Continued)

OTHER PUBLICATIONS

Dudek, et al, "Lithography-Independent NanometeT Silicon MOSFET's on Insulator", IEEE Transactions on Electron Devices, vol. 43, No. 10, Oct. 1996, pp. 1626-1631.

(Continued)

*Primary Examiner*—Matthew C Landau

(57) ABSTRACT

A process and an architecture related to a vertical MOSFET device and a capacitor for use in integrated circuits. The integrated circuit structure includes a semiconductor layer with a major surface and further including a first doped region formed in the surface. A second doped region of a different conductivity type than the first doped region is positioned over the first region. A third doped region of a different conductivity type than the second region is positioned over the second region. The integrated circuit includes a capacitor having a bottom plate, dielectric layer and a top plate. In an associated method of manufacture, a first device region. is formed on a semiconductor layer. A field-effect transistor gate region is formed over the first device region. A capacitor comprising top and bottom layers and a dielectric layer is formed on the semiconductor layer.

13 Claims, 16 Drawing Sheets

U.S. PATENT DOCUMENTS

| | | | |
|---|---|---|---|
| 5,276,343 | A | 1/1994 | Kumagai et al. |
| 5,342,797 | A | 8/1994 | Sapp et al. |
| 5,414,289 | A | 5/1995 | Fitch et al. |
| 5,576,238 | A | 11/1996 | Fu et al. |
| 5,578,850 | A | 11/1996 | Fitch et al. |
| 5,612,563 | A | 3/1997 | Fitch et al. |
| 5,668,391 | A | 9/1997 | Kim et al. |
| 5,744,846 | A | 4/1998 | Batra et al. |
| 5,780,888 | A | 7/1998 | Maeda et al. |
| 5,869,859 | A | 2/1999 | Hanagasaki et al. |
| 5,994,735 | A | 11/1999 | Maeda et al. |
| 6,027,975 | A | 2/2000 | Hergenrother et al. |
| 6,072,216 | A | 6/2000 | Williams et al. |
| 6,133,099 | A | 10/2000 | Sawada et al. |
| 6,197,641 | B1 | 3/2001 | Hergenrother et al. |
| 6,297,531 | B2 | 10/2001 | Armacost et al. |

FOREIGN PATENT DOCUMENTS

| | | |
|---|---|---|
| GB | 2350929 | 12/2000 |
| GB | 2366449 | 3/2002 |

OTHER PUBLICATIONS

Risch, et al, "Vertical MOS Transistors with 70 nfl Channel Length", IEEE Transactions on Electron Devices, vol. 43, No. 9, Sep. 1996, pp. 1495-1498.

Takato, et al, Impact of Surrounding Gate Transistor (SGT) for Ultra-High-Density LSI's', IEEE Transactions on Electron Devices, vol. 38, No. 3, Mar. 1991, pp. 573-577.

Takato, et al, "High Performance CMOS Surrounding Gate Transistor (SGT) for Ultra High Density LSIs", IEDM 1988, pp. 222-225.

Hergenrother, et al, "The Vertical Replacement-Gate (VRG) MOSFET: A 50-nm Vertical MOSFET withLithography-Independent Gate Length", Technical Digest of IEDM, 1999, pp. 75-78.

Oh, et al, "50 nm Vertical Replacement-Gate (VRG) pMOSFETs", IEEE 2000.

Hergenrother, et al, "The Vertical Replacement-Gate (VRO) MOSFETt: A High Performance Vertical MOSFET with Lithography-Independent Critical Dimensions", no publication infonnation apparent from document.

Monroe, et at, "The Vertical Replacement-Gate (VRG) Process for Scalable, General-purpose Complementary Logic", Paper 7.5, pp. 1-7, date and publication information unknown.

FABRICATION METHOD

CROSS-REFERENCE TO RELATED APPLICATIONS

This application is a divisional of U.S. application Ser. No. 10/819,253 filed on Apr. 5, 2004, which is a continuation of U.S. application Ser. No. 09/956,381 filed on Sep. 18, 2001, now abandoned, the disclosures of which are incorporated herein by reference.

FIELD OF THE INVENTION

The present invention is directed to semiconductor devices incorporating junctions of varying conductivity types designed to conduct current and methods of making such devices. More specifically, the present invention relates to a design and a process for fabricating polysilicon-nitride-polysilicon, metal-nitride-polysilicon and polysilicon-oxide-polysilicon capacitors using a fabrication process compatible with the fabrication of vertical transistors.

BACKGROUND OF THE INVENTION

Enhancing semiconductor device performance and increasing device density, to increase the number of devices per unit area, continue to be important objectives of the semiconductor fabrication industry. Device density is increased by making individual devices smaller and packing devices more compactly. Also, as the device dimensions (also referred to as feature size or design rules) decrease, the methods for forming devices and their constituent elements must be adapted. For instance, production line feature sizes are currently in the range of 0.25 microns to 0.18 microns, with an inexorable trend toward small dimensions. However, as the device dimensions shrink, certain manufacturing limitations arise, especially with respect to the lithographic processes. In fact, current photolithographic processes are nearing the point where they are unable to accurately manufacture devices at the required minimal sizes demanded by today's device users.

Currently most metal-oxide-semiconductor field effect transistors (MOSFETs) are formed in a lateral configuration with the current flowing parallel to the plane of the substrate or body surface in which the source and drain regions are formed. As the size of these MOSFET devices decreases to achieve increased device density, the fabrication process becomes increasingly difficult. In particular, the lithographic process for creating the channel is problematic, as the wavelength of the radiation used to delineate an image in the photolithographic pattern approaches the device dimensions. As applied to lateral MOSFETs, the channel length is approaching the point where it cannot be precisely controlled using these photolithographic techniques.

Recent advances in packing density have resulted in several variations of a vertical MOSFET. In particular, the vertical device is described in Takato, H., et al., "Impact of Surrounding Gates Transistor (SGT) for Ultra-High-Density LSI's, IEEE Transactions on Electron Devices, Volume 38(3), pp. 573-577 (1991), has been proposed as an alternative to the planar MOSFET devices. Recently, there has been described a MOSFET characterized as a vertical replacement gate transistor. See Hergenrother, et al, "The Vertical-Replacement Gate (VRG) MOSFET: A 50-nm Vertical MOSFET with Lithography-Independent Gate Length," Technical Digest of the International Electron Devices Meeting, p. 75, 1999. Commonly owned U.S. Pat. Nos. 6,027,975 and 6,197, 641, which are hereby incorporated by reference, teach certain techniques for the fabrication of vertical replacement gate (VRG) MOSFETs.

To fabricate operational circuitry on an integrated circuit (IC), it is also necessary to incorporate passive elements into the IC fabrication process. In particular, capacitors are formed as junction capacitors or thin-film capacitors. As is known, the application of a reverse bias voltage across a semiconductor junction forces the mobile carriers to move away from the junction thereby creating a depletion region. The depletion region acts as the dielectric of a parallel-plate capacitor, with the depletion width representing the distance between the plates. Thus the junction capacitance is a function of the depletion width, which is in turn a function of the applied reverse bias and the impurity concentrations in the immediate vicinity of the junction. Thin-film capacitors, which are a direct miniaturization of conventional parallel-plate capacitors, are also fabricated for use on integrated circuits. Like the discrete capacitor, the thin-film capacitor comprises two conductive layers separated by a dielectric. One type of thin-film capacitor is formed as a metal-oxide-semiconductor capacitor, having a highly doped bottom plate, silicon dioxide as the dielectric, and a metal top plate. A thin-film capacitor can also be formed with two metal layers forming the top and bottom plates, separated by a dielectric, such as silicon dioxide or silicon nitride. Silicon nitride is preferred since it offers a higher dielectric constant and can thus provide a higher capacitance per area. The metal-oxide semiconductor capacitor structure is the most common because it is readily compatible with conventional integrated circuit processing technology. The capacitance per unit area of a thin-film capacitor is equal to the ratio of the permittivity and the dielectric thickness. Although thin-film capacitors offer higher capacitance values per unit area and fewer parasitic problems, they can fail by breakdown of the dielectric when the dielectric voltage rating is exceeded.

SUMMARY OF THE INVENTION

The present invention teaches a process for fabricating integrated circuit structures including both MOSFET devices and various capacitor configurations. The process includes forming a first device region, either a source or drain region in a semiconductor substrate. A multilayer stack of at least three layers is formed over the first device region. The middle layer of the three layers is a sacrificial layer, which is later be removed and replaced by a gate electrode. A window is formed in the three layers followed by the formation of doped semiconductor material, i.e., a semiconductor plug, within the window. A second device region (either a source region or a drain region) is formed at the upper end of the semiconductor plug. The sacrificial layer is then removed and a gate oxide grown or deposited over the exposed portion of the semiconductor plug. The gate electrode is then formed adjacent the gate oxide. In one embodiment, the gate electrode further extends to a region of the substrate beyond the MOSFET device, where it serves as the bottom plate of a capacitor. A dielectric layer is formed over the bottom plate, followed by a top capacitor plate.

In another embodiment, a capacitor is formed in a second window formed in the multilayer stack. In particular, the second window includes a first conformal conductive layer underlying a dielectric layer. The second conductive layer (the capacitor top plate) fills the remaining volume in the window. As a result, the three layers in the window form a capacitor. It is especially advantageous that the formation of each of these capacitors does not add new mask steps when applied to the basic VRG MOSFET process flow. Only mask changes are required to fabricate both the planar and the windowed capacitors according to the teachings of the present invention. The teachings of the present invention for forming the various capacitor embodiments are applicable not only to the VRG MOSFET process, but can be applied to other vertical transistor processes.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described features are not drawn to scale but are drawn to emphasize specific features relevant to the invention. Reference characters denote like elements throughout the figures and text.

Description of the Preferred Embodiments

The present invention is directed to capacitor structures and associated fabrication techniques for fabricating polysilicon-nitride-polysilicon (PNP), metal-nitride-polysilicon (MNP) and polysilicon-oxide-polysilicon (POP) capacitors using a process similar to and compatible with the fabrication of vertical replacement gate metal-oxide-semiconductor field-effect transistors (VRG MOSFETs). In particular, it is desirable to manufacture the capacitors and the VRGs on a single silicon substrate to minimize cost and fabrication complexity, with a minimum number of extra steps required to fabricate the capacitors. The present invention discloses capacitor devices and processes for fabricating the capacitors that achieve these goals.

With regard to the fabrication of transistors and integrated circuits, the term "major surface" refers to that surface of the semiconductor layer about which a plurality of transistors are fabricated, e.g., in a planar process. As used herein, the term "vertical" means substantially orthogonal with respect to the major surface. Typically, the major surface is along a <100> plane of a monocrystalline silicon substrate on which the field-effect transistor devices are fabricated. The term "vertical transistor" means a transistor with individual semiconductor components vertically oriented with respect to the major surface so that the current flows vertically from drain to source (electrons flow from source to drain). By way of example, for a vertical MOSFET, the source, channel and drain regions are formed in relatively vertical alignment with respect to the major surface.

Figure 1A:
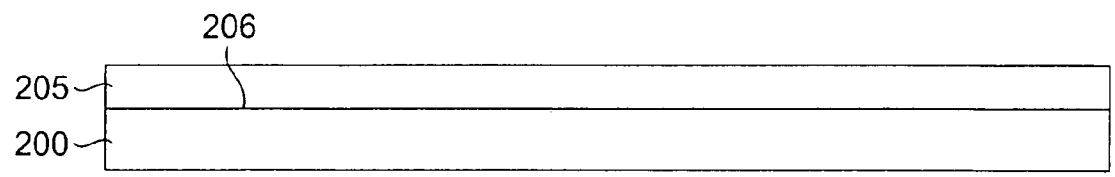
FIGS. 1A through 1P are cross-sectional views illustrating the process steps for fabricating a poly-nitride-poly or a metal-nitride-poly capacitor.
Figure 1B:
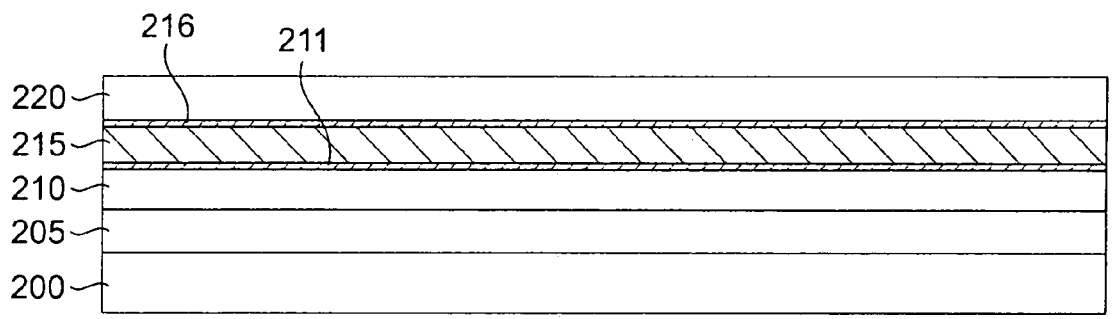
Figure 1C:
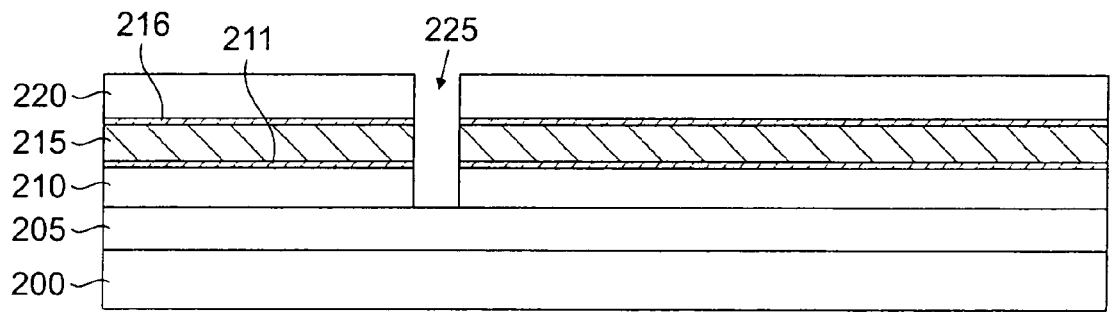
Figure 1D:
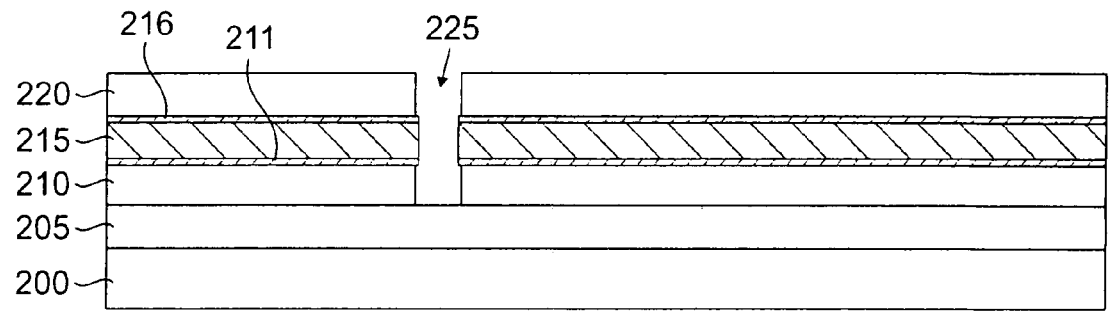
Figure 1E:
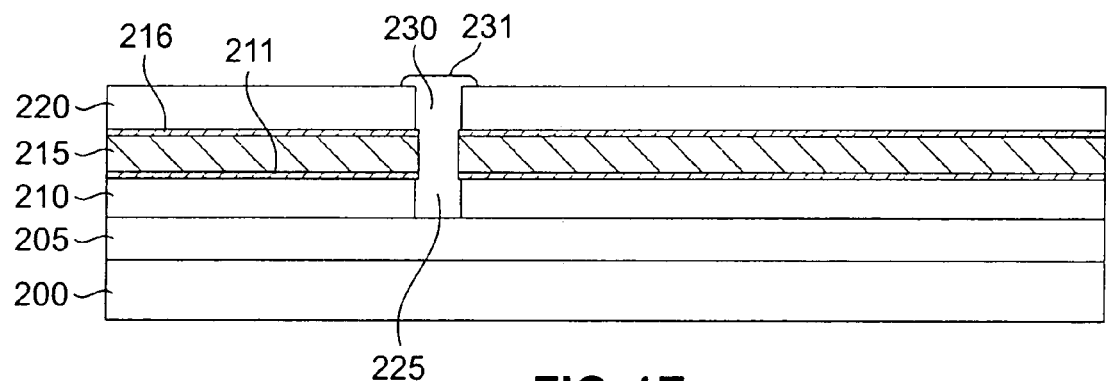
Figure 1F:
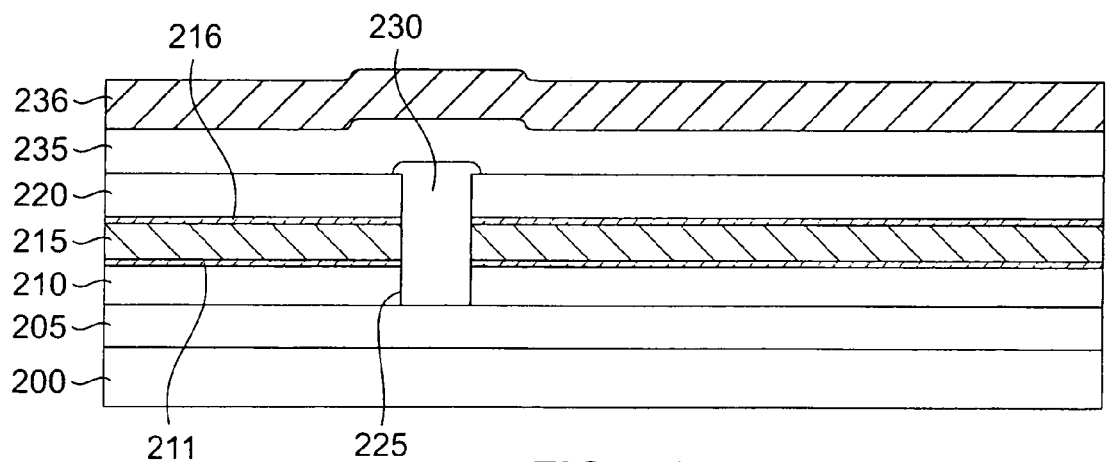
Figure 1G:
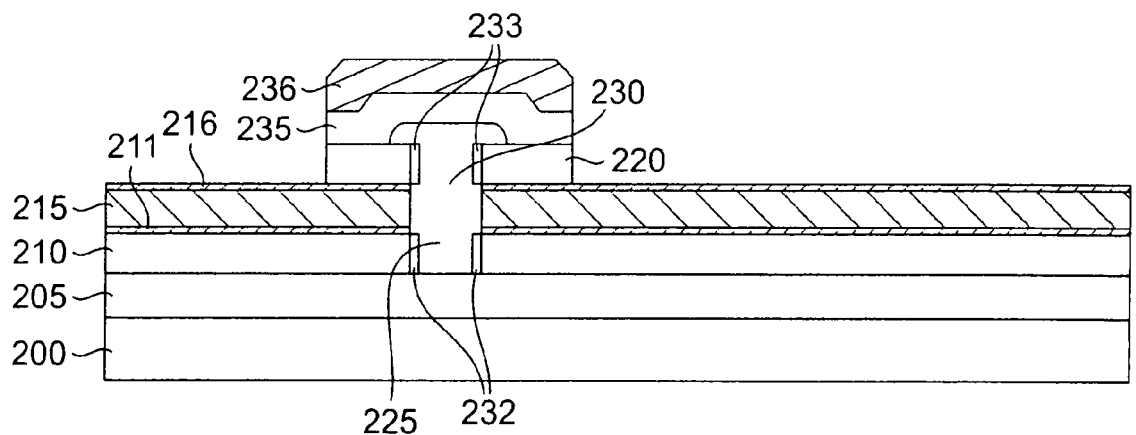
Figure 1H:
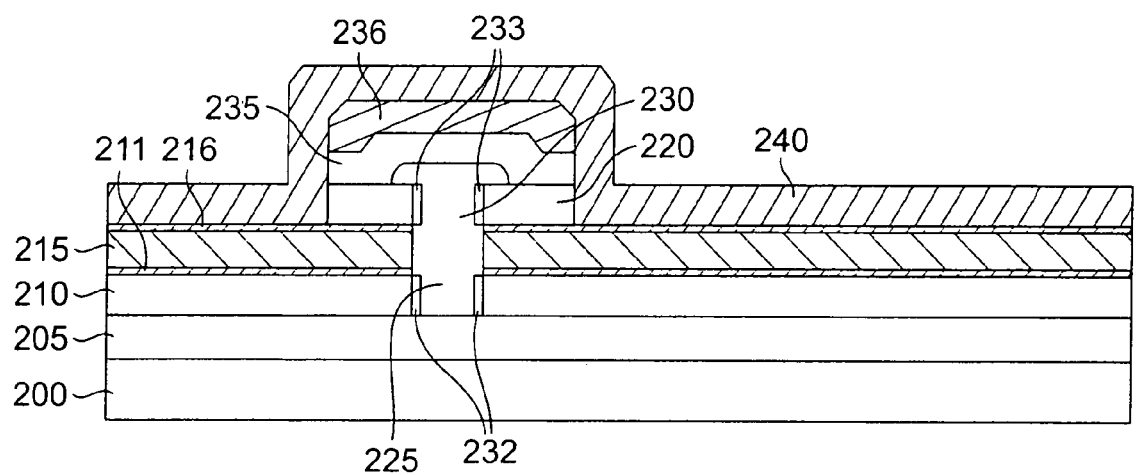
Figure 1I:
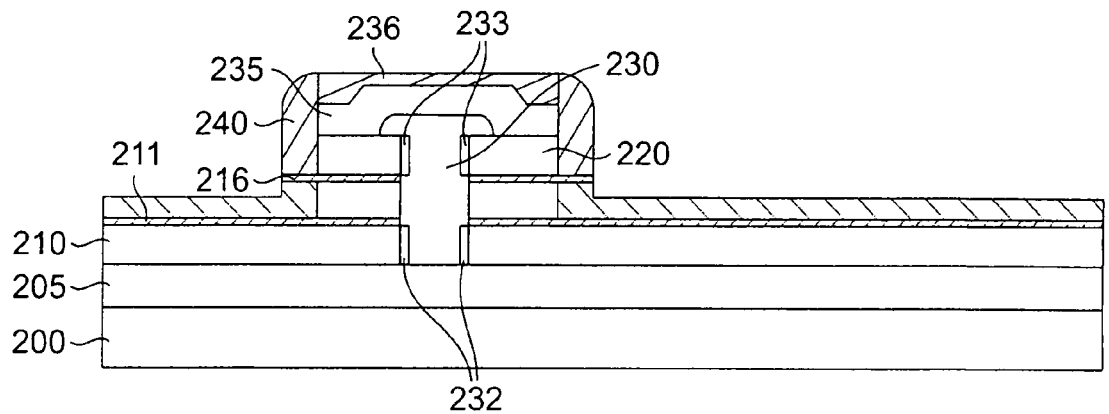
Figure 1J:
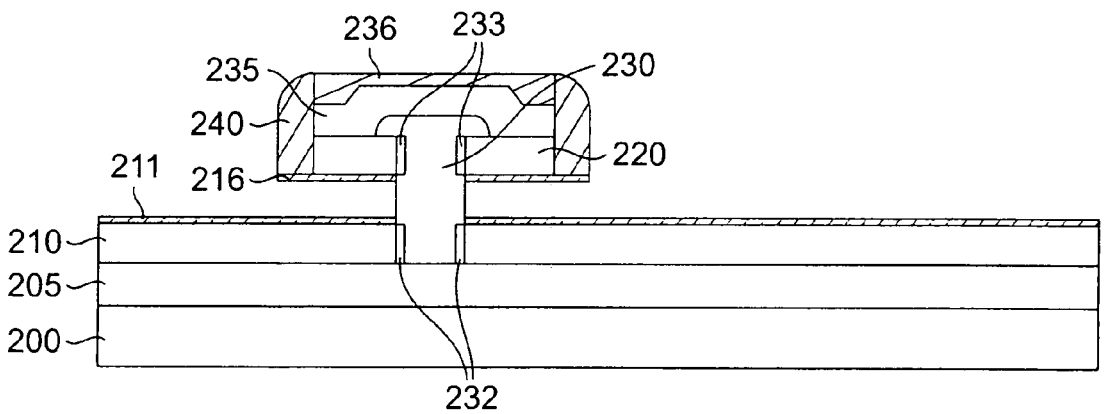
Figure 1K:
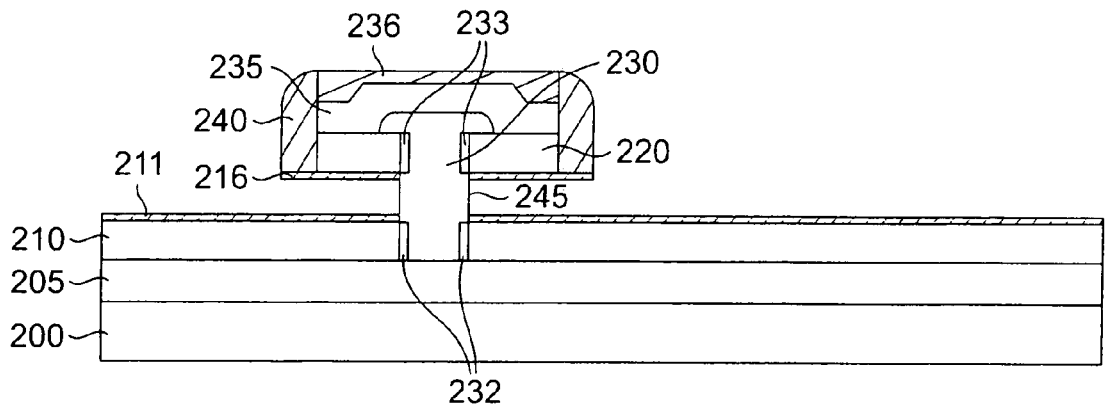
Figure 1L:
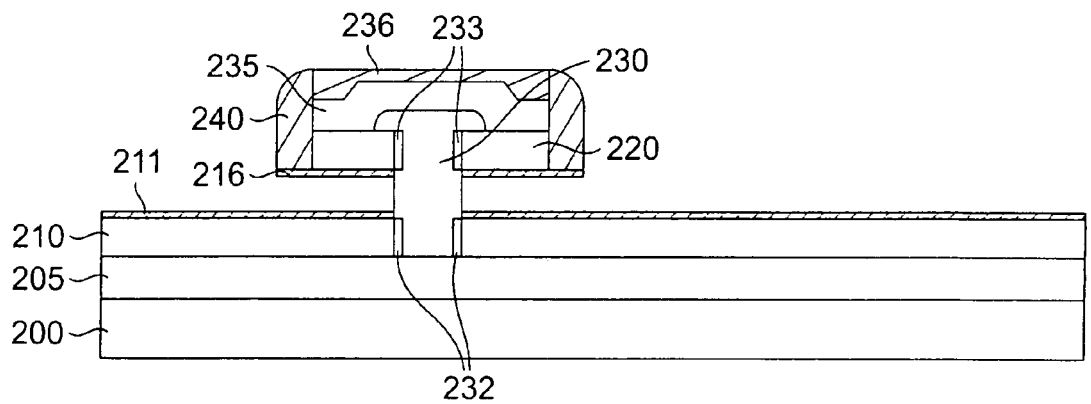
Figure 1M:
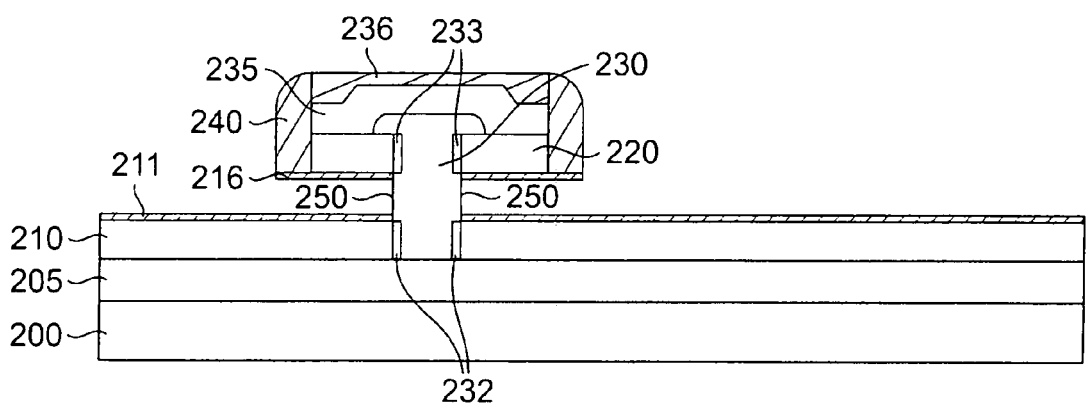
Figure 1N:
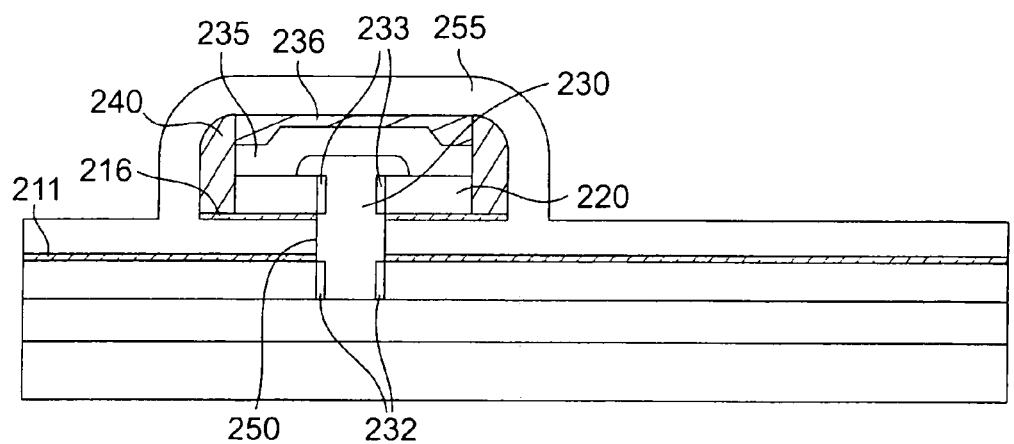
Figure 1O:
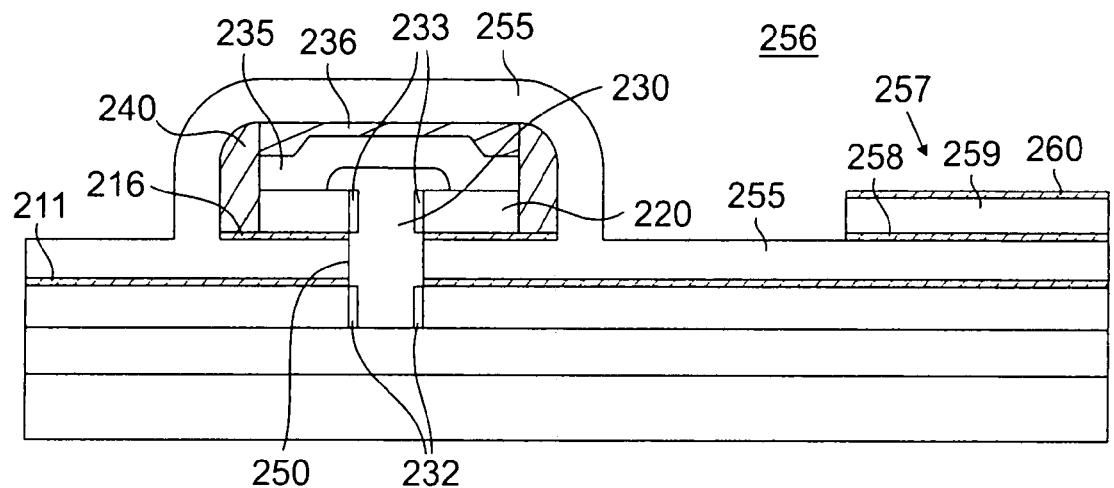
Figure 1P:
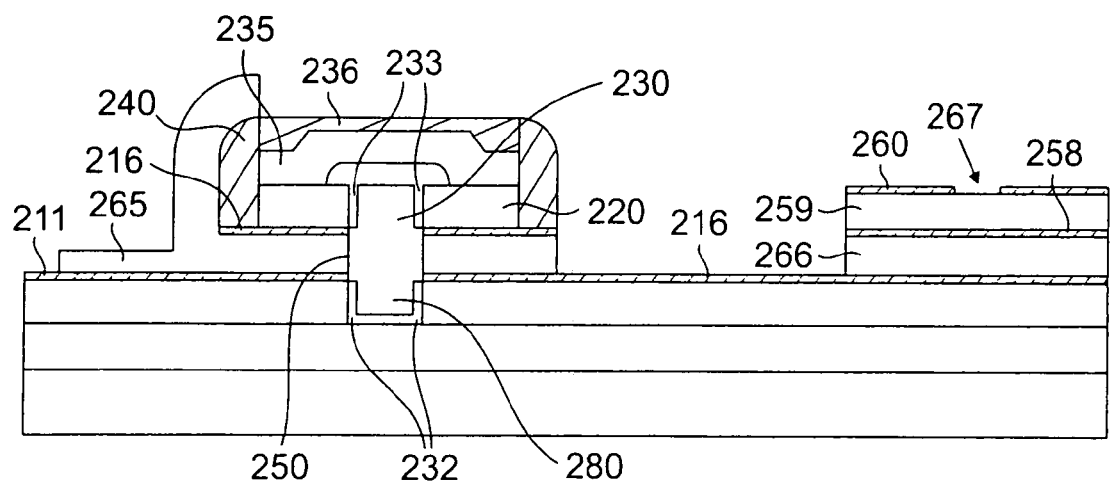
Figure 2A:
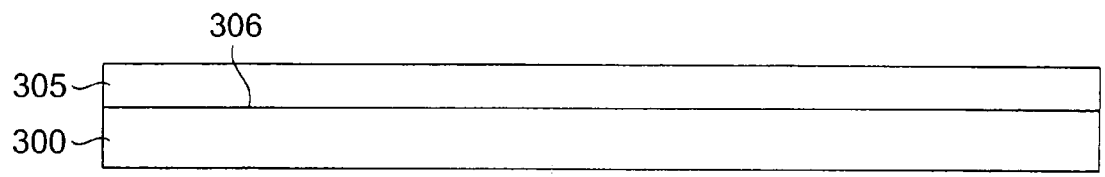
FIGS. 2A through 2W are cross-sectional views illustrating the process steps for fabricating a poly-oxide-poly capacitor.

Each of FIGS. 1A through 1P and 2A and through 2V illustrate a partial cross-section of an integrated circuit structure during various stages of fabrication, to configure an exemplary circuit function according to the present invention. From the description, it will become apparent how certain capacitors may be configured, alone or in combination with other devices, e.g., bipolar junction transistors, junction field-effect transistors and metal-oxide-semiconductor field-effect transistors to form an integrated circuit.

One embodiment of the present invention for fabricating vertical replacement gate MOSFETs and capacitors on a single silicon substrate is illustrated with reference to FIGS. 1A through 1P. The various semiconductor features and regions described therein are preferably composed of silicon, but it is known to those skilled in the art that other embodiments of the invention may be based on other semiconductor materials (including compound or heterojunction semiconductors) alone or in combination. With references to FIGS. 1A through 1P, fabrication of the vertical MOSFET device is illustrated in the left side of the figures and fabrication of the capacitor is illustrated in the right side of the Figures. However, it is not necessary for the capacitor and MOSFET devices to be fabricated adjacent each other; the side-by-side representation is utilized solely to illustrate the compatibility between the two processes. The capacitors fabricated according to the teachings of the present invention can be formed anywhere on the integrated circuit.

Referring to FIG. 1A, a heavily doped source region 205 is formed along a major surface 206 in a silicon substrate 200, preferably a substrate having a <100> crystal orientation. In this embodiment, of a vertical MOSFET, the source region of the device is formed in the silicon substrate and the drain region is formed atop a subsequently formed vertical channel, as will be discussed further. In an alternative embodiment, the drain region is formed in the substrate and the source region is formed atop the vertical channel. The former embodiment is the subject of this description. However, from this description, one skilled in the art can easily form a device in which the drain region is formed in the silicon substrate and the source region is formed overlying the subsequently formed vertical channel.

The depth of the heavily doped source region 205, the dopant type (e.g., n-type or p-type) and the concentration therein are all matters of design choice. An exemplary source region 205, wherein the dopant is phosphorous (P), arsenic (As), antimony (Sb) or boron (B) has a dopant concentration in the range of about $1 \times 10^{19}$ atoms/cm$^3$ to about $5 \times 10^{20}$ atoms/cm$^3$. Depths of the source region 205 and the substrate 200 less than about 200 nm are contemplated as suitable.

In FIG. 1B, five layers of material 210, 211, 215, 216 and 220 are formed over the source region 205 in the silicon substrate 200. The insulating layer 210 electrically isolates the source region 205 from what will eventually be the overlying gate electrode. Thus, the insulating layer 210 is composed of a material and has a thickness that is consistent with this insulating objective. One example of a suitable material is doped silicon dioxide. The use of a doped insulating layer 210 is advantageous in those embodiments where the insulating layer 210 serves as a dopant source, as will be explained below, to form source/drain extension regions (within the device channel) through a solid phase diffusion process. Examples of a silicon dioxide dopant source are PSG (phospho-silicate glass, i.e., a phosphorous-doped silicon dioxide) and BSG (boro-silicate glass, i.e., a boron-doped silicon dioxide), deposited, for example, by plasma-enhanced chemical vapor deposition (PECVD). Suitable thicknesses for the insulating layer 210 are in the range of about 25 nm to about 250 nm.

An etch stop layer 211 is formed over the insulating layer 210. An etch stop, as is known to those skilled in the art, is designed to prevent an etch expedient from proceeding to an underlying or overlaying layer or layers. The etch stop therefore, has a significantly greater etch resistance to a selected etchant than the adjacent layer or layers that are to be removed by the etchant. Specifically in this case, for the selected etchant, the etch rate of the etch stop layer 211 is much slower than the etch rate of the overlying layer 215, which, as will be discussed below, is a sacrificial layer. One skilled in the art is aware that the selection of an etch stop layer material is determined by the particular etch expedient used to etch the overlying/underlying layers. In the process of the present invention, where the overlying sacrificial layer is undoped silicon dioxide (e.g., silicon dioxide formed from tetraethylene ortho silicate (TEOS)), an etch stop material that effectively stops etchants for undoped silicon dioxide from penetrating to the layers beneath the etch step layer 211 is selected. Silicon nitride ($Si_3N_4$) is contemplated as a suitable etch stop material. The thickness of the etch stop material layer is also dependent on the resistance of the etch stop material to the selected etchant, relative to the material depth to be removed through the etch process. That is, to be an effective etch stop, the etchant cannot penetrate the etch stop layer in the time required to remove the desired layer or layers.

The etch stop layer 211 also functions as an offset spacer, where the thickness of the offset spacer is determined by the thickness of the etch stop layer 211. In the context of the present invention, the offset spacer controls the position of the source/drain extensions relative to the device channel. Specifically, the presence of the offset spacer limits the extent to which the source/drain extensions extend under the gate. One skilled in the art is aware that the farther the source/drain extensions extend under the gate, the greater the adverse consequences on device performance, i.e., the gate/source and gate/drain overlap capacitance increase. One skilled in the art will also appreciate that the offset spacer cannot be so thick as to create a series resistance between the source/drain extensions and the inversion layer formed under the gate, which would also cause unacceptable device performance. The etch stop layer 211 performs the offset spacer function by its presence between the insulating layer 210 and the sacrificial layer 215 when the insulating layer 210 serves as a dopant source. As the dopants diffuse from the insulating layer 210, the degree of overlap between the source/drain extension and the gate can be controlled through the thickness of the etch stop layer 211 together with control over the dopant diffusion rates.

A sacrificial layer 215 is formed over the etch stop layer 211. The material of the sacrificial layer 215 has a significantly different etch resistance to the selected etchant than the etch stop layer 211. Specifically, for the selected etchant, the etch rate of the sacrificial layer 215 is much higher than the etch rate of the etch stop layer 211. The thickness of the sacrificial layer 215 is selected to correspond to the gate length of the final device, as the sacrificial layer 215 will be removed and the gate of the device formed in the vacated space. Silicon dioxide, formed through a TEOS process, is an example of a suitable semiconductor material for the sacrificial layer 215.

An etch stop layer 216 is formed over the sacrificial layer 215. The etch stop layer 216 serves the same functions as the etch stop layer 211. Therefore, the considerations that govern the selection of the material and thickness for the etch stop layer 211 also govern the selection of the material and thickness for the etch stop layer 216.

An insulating layer 220 is formed over the etch stop layer 216. It is advantageous if the insulating layer 220 has the same etch rate (in the selected etchant) as the insulating layer 210. In fact from the standpoint of processing efficiency, it is advantageous if the material of the insulating layer 210 is the same as the material of the insulating layer 220. In the embodiment where the insulating layer 220 also serves as a dopant source, the insulating layer 220 is PSG or BSG.

Referring to FIG. 1C, an opening, trench or window 225 is etched through the insulating layer 210, the etch stop layer 211, the sacrificial layer 215, the etch stop layer 216 and the insulating layer 220, downwardly to the source region 205. The window horizontal dimension is determined by the desired device performance characteristics, the size constraints for the device under fabrication, and the limitations of the lithographic process utilized to form the window 225. The length of the window 225 i.e., the length being orthogonal to both the horizontal and vertical dimensions in the FIG. 1C cross-section, is largely a matter of design choice. For a given horizontal dimension, the current capacity of the channel to be formed later in the window 225 increases with increasing window length. The window 225 is then subjected to a chemical cleaning process, (e.g., RCA or piranha clean). The piranha process utilizes a sulfuric acid and hydrogen peroxide solution to clean the silicon at the bottom of the window 225. As a result of this cleaning step, small portions of the insulating layers 210 and 220 forming a boundary with the window 225 are removed. The indentations created are illustrated in FIG. 1D. As shown, the sacrificial layer 215 and the etch stop layers 211 and 216 extend beyond the edge of the insulating layers 210 and 220.

Referring to FIG. 1E, with the source region 205 exposed by the etching process that created the window 225, monocrystalline silicon can now be epitaxially grown from the source region 205 at the bottom of the window 225 to form device-quality crystalline semiconductor material 230, including a top portion 221, in the window 225. The crystalline semiconductor material 230 is suitable for serving as a channel of the device and for forming source/drain extension regions above and below the channel region. The crystalline semiconductor material 230 may also be formed by depositing an amorphous or polycrystalline material and then re-crystallizing the material, e.g., by a conventional furnace anneal or a laser anneal.

The crystalline semiconductor material 230 formed in the window 225 must be doped to form the device channel, as well as the source and drain extensions. Dopants of one type (i.e., n-type or p-type) are introduced into the crystalline semiconductor material 230 to form source and drain extensions and dopants of the opposite conductivity type are introduced to form the channel. A variety of techniques to dope the crystalline semiconductor material 230 are contemplated as suitable. In-situ doping of the crystalline semiconductor material 230 during formation or implantation of dopants into the crystalline semiconductor material 230 after formation are contemplated as suitable processes to form the channel.

One skilled in the art is familiar with the manner in which dopants are introduced in situ as a layer of material is formed via chemical vapor deposition, and such techniques are not described in detail herein. Generally, the dopants are introduced into the atmosphere at the appropriate point in the material deposition process so that the dopants are present in the desired location in the crystalline semiconductor material 230 and at the desired concentration. Appropriate dopant gases include phosphine and diborane. In another embodiment, channel dopants are implanted in the crystalline semiconductor material 230 after formation.

To form the bottom source/drain extensions, dopants can be diffused from the source region 205 into the bottom of the crystalline semiconductor material 230. An alternate technique for forming the source/drain extensions is diffusion of the dopants from the insulating layers 210 and 220, when those layers are formed of PSG or BSG materials as suggested above. Generally, in this solid phase diffusion process, a doped (e.g., with arsenic, phosphorous or boron) oxide (e.g., silicon dioxide) serves as the dopant source. At elevated temperatures, the dopant is driven from the doped oxide to the adjacent undoped (or lightly doped) regions. In this application, the dopant is driven into the crystalline semiconductor material 230. This technique is advantageous because the doped area, that is the source/drain extensions, are defined by the interface between the crystalline semiconductor material 230 and the insulating layers 210 and 220 that serve as the dopant sources. This technique allows the formation of self-aligned source/drain extensions (i.e. the source drain extensions are aligned with the gate). Examples of solid state diffusion techniques are described in Ono, M., et al, "Sub-50 nm Gate Length N-MOSFETS with 10 nm Phosphorus Source and Drain Junctions," IEDM93, pp. 119-122 (1993) and Saito, M., et al., "An SPDD D-MOSFET Structure Suitable for 0.1 and Sub 0.1 Micron Channel Length and Its Electrical Characteristics," IEDM92, pp. 897-900 (1992), which are hereby incorporated by reference. The dopant concentration in the source/drain extensions 232 and 233 is typically about at least $1 \times 10^{19}/cm^3$, with dopant concentrations of about $5 \times 10^{19}/cm^3$ contemplated as advantageous. Using this solid phased diffusion technique, very shallow source/drain extensions 232 and 233 are obtainable. The source/drain extensions 232 and 233 are shown as penetrating into the crystalline semiconductor material 230, preferably less than one half the width of the crystalline semiconductor material 230. Limiting the dopant penetrations in this manner avoids overlap of the doped regions from opposite sides of the crystalline semiconductor material 230. Also, the distance that the source/drain extensions 232 and 233 extend under the gate 265 is preferably limited to less than one-fourth of the gate length. As is know to those skilled in the art, the dopants in the source/drain extensions 232 and 233 are of the opposite type from the dopants in the channel of the crystalline semiconductor material 230.

Preferably, after the crystalline semiconductor material 230 is doped, the device is not subjected to conditions that will significantly affect the distribution of the dopants in the crystalline semiconductor material 230. Consequently, with this approach after this step the substrate will not be exposed to temperatures that exceed 1100.degree. C. In fact, it is advantageous if the substrate is not exposed to temperatures in excess of 1000.degree. C. after this point in the process. In certain embodiments, the substrate is not exposed to temperatures that exceed 900.degree. C. for prolonged periods of time (e.g. in excess of several minutes). However, the substrate can be subjected to rapid thermal annealing (at temperatures of about 1000.degree. C.) without adversely affecting the distribution of the dopants in the crystalline semiconductor material 230.

Next a conformal drain layer 235 is formed over the insulating layer 220 and the top portion 231. The drain layer 235 provides a self-aligned top contact (the drain contact in this embodiment). One example of the suitable material for the drain layer 235 is doped polycrystalline silicon. The selected dopant is opposite in type to that used to form the device channel. The concentration of the dopant is greater than about $1 \times 10^{20}$ atoms/$cm^3$.

As further illustrated in FIG. 1F, a conformal layer 236 is deposited over the drain layer 235. The material selected for the layer 236 has an etch rate that is significantly slower than the etch rate of the sacrificial layer 215, based on the etchant selected to remove the sacrificial layer 215. It is advantageous if the material selected for the layer 236 is the same as the material of the etch stop layers 211 and 216. One example of suitable material is silicon nitride.

As shown in FIG. 1G, using conventional lithographic techniques, the drain layer 235, the layer 236, and the insulation layer 220 are patterned (using one or more dry etch steps) so that only those portions overlying or adjacent the crystalline semiconductor material 230 and the top portion 231 remain. The etch stop layer 216 serves to prevent the etch expedients from reaching the underlying layers during this process.

According to another embodiment of the present invention, rather than formed as discussed above, the source/drain extensions 232 and 233 are formed at this point in the process by solid phase diffusion from the doped insulating layers 210 and 220.

As illustrated in FIG. 1H, a conformal layer 240 is then deposited over the entire structure. The material for layer 240 is selected to have an etch rate that is significantly slower than the etch rate of the sacrificial layer 215 in the etchant selected to remove the sacrificial layer 215. One example of a suitable material for the layer 240 is silicon nitride. The thickness of the layer 240 is selected so that the remaining portions of the drain layer 235, the layer 236, and the insulating layer 220 are protected from contact with subsequent etchants.

The layer 240 is then etched using an anisotropic etch such as dry plasma etch, which also removes portions of the etch stop layer 216 and the sacrificial layer 215. As is known to those skilled in the art, an anisotropic etch material etches vertically, but not laterally along the surface. Therefore, as shown in FIG. 1I, the only portion of the layer 240 that remains after the anisotropic etch is that portion laterally adjacent to the stack of the insulating layer 220 and the drain layer 235 and the layer 236. As a result of this etch process, a portion of the etch stop layer 216 has been removed and the sacrificial layer 215 is now exposed.

The device is then subjected to a wet etch (e.g., an aqueous hydrofluoric acid) or an isotropic dry etch (e.g., an anhydrous hydrofluoric acid), for removing the remainder of the sacrificial layer 215. The result is illustrated in FIG. 1J. The insulating layer 210 is still covered by the etch stop layer 211. The remaining portion of the etch stop layer 216 and the layers 236 and 240 encapsulate the insulating layer 220 and the drain layer 235, so that these latter layers remain isolated from contact with the etch expedients. The exposed portion of the crystalline semiconductor material 230 corresponds to the thickness of the sacrificial layer 215 and defines the physical channel length of the device.

Referring to FIG. 1K, a sacrificial layer of silicon dioxide 245 is thermally grown or deposited on the exposed surface of the crystalline semiconductor material 230. A sacrificial silicon dioxide thickness on the order of less than about 10 nm is contemplated as suitable. The sacrificial silicon dioxide 245 is then removed (see FIG. 1L) using a conventional isotropic etch (e.g. an aqueous hydrofluoric acid). As a result of the formation and then the removal of the sacrificial silicon dioxide 245, the surface of the crystalline semiconductor material 230 is smoother and some of the sidewall defects are removed. The etch stop layers 211 and 216 prevent the removal expedient from contacting the insulating layers 210 and 220 and the drain layer 235. This step is not necessarily required for the process of the present invention, but can be executed to remove excess sidewall defects if present.

A layer of gate dielectric 250 (also referred to as a gate oxide) is then formed on the exposed portion of the crystalline semiconductor material 230. Suitable dielectric materials include, for example, silicon dioxide, silicon oxynitride, silicon nitride or metal oxide. The thickness of the gate dielectric 250 is about 1 nm to about 20 nm. One example of a suitable thickness is 6 nm. In one embodiment, the silicon dioxide layer is formed by heating the substrate to a temperature in the range of about 700.degree. C. to about 1000.degree. C. in an oxygen-containing atmosphere. Other expedients for forming the gate dielectric include chemical vapor deposition, jet vapor deposition or atomic layer deposition, all of which are contemplated as suitable. Conditions for forming the gate dielectric 250 of the desired thickness are well known to those skilled in the art.

Referring to FIG. 1N, a gate electrode is formed by depositing a gate electrode layer 255 of sufficiently conformal and suitable gate material, e.g. a layer of doped amorphous silicon in which the dopant is introduced in situ. The amorphous silicon is then subsequently re-crystallized (by melting) to form polycrystalline silicon. As mentioned above, this must be accomplished using conditions that do not significantly affect the dopant profiles in the crystalline semiconductor material 230. Other examples of suitable gate electrode materials include polycrystalline silicon, silicon-germanium and silicon-germanium-carbon. Metals and metal-containing compounds that have a suitably low resistivity and are compatible with the gate dielectric material and the other semiconductor processing steps are also contemplated as suitable gate electrode materials. For CMOS (complementary metal-oxide-semiconductor) applications, it is advantageous if the gate material has a work function near the middle of the band gap of the semiconductor material 230. Examples of such metals include titanium, titanium nitride, tungsten, tungsten silicide, tantalum, tantalum nitride and molybdenum. Suitable expedients for forming the gate electrode material include chemical vapor deposition, electroplating and combinations thereof. The gate electrode layer 255 also forms the bottom plate of the subsequently formed capacitor, as discussed below.

A poly-nitride-poly (PNP) or a metal-nitride-poly (MNP) capacitor 256 is now formed in a region 257 of the FIG. 10 structure. The gate electrode layer 255 deposited as described above forms the bottom plate of the capacitor 256. At this point in the process, the VRG MOSFET is masked off and a silicon nitride layer 258, serving as the capacitor dielectric, is formed over the gate electrode layer 255 in the region 257. Because silicon nitride has a higher permittivity than silicon dioxide, higher capacitance values are achievable for the same dielectric thickness. But it is known that any dielectric material can be used as the capacitor dielectric. A conductive layer 259 is formed over the silicon nitride layer 258. To form a poly-oxide-poly capacitor, the conductive layer 259 is doped polysilicon with a doping concentration of approximately at least $1.\times 10^{20}$ cm.sup.−3. To form a metal-nitride-poly capacitor, the conductive layer 259 is formed of a metal material. Following deposition of the conductive layer 259, it is desirable, but not required, to deposit another nitride layer 260 thereover.

As shown in FIG. 1P, the MOSFET gate electrode layer 255 is patterned and now referred to as a gate 265. Similarly, the bottom plate, (i.e., the gate electrode layer 255) of the capacitor 256 is also patterned and now referred to as a bottom capacitor plate 266. In a circuit configuration where it is required to connect the MOSFET gate to the capacitor, the gate electrode is not patterned so that the conductive material bridging the MOSFET gate and the bottom capacitor plate remains intact. As shown, if required, a window 267 is etched in the silicon nitride layer 260, to provide connectivity to the underlying metal or polysilicon layer, referred to generally as a top capacitor plate 259. The configuration of the MOSFET gate 265 and the bottom capacitor plate 266 are largely matters of design choice. However, it should be noted that the gate 265 surrounds the portion of the crystalline semiconductor material 230 where the gate oxide has been formed. In one embodiment, the bottom capacitor plate 266 can be configured so that access is provided thereto in the third dimension, which is not shown in FIG. 1P. At this point in the fabrication process the MOSFET has been formed, therefore the crystalline semiconductor material 230 can be referred to as a channel 280. In another embodiment, an insulator 351 is disposed between the gate 265 and the bottom capacitor plate 266.

In yet another embodiment of the present invention, at this point in the process dopants are driven into the crystalline semiconductor material 230 by solid phase diffusion from the insulating layers 210 and 220 to form source/drain extensions 232 and 233 for the MOSFET device.

In yet another alternative embodiment (not shown) the top portion 231 of the crystalline semiconductor material 230 (see FIG. 1E) is polished back so that the top portion 231 is co-planar with the top surface of the insulating layer 220. An expedient such as chemical mechanical polishing is contemplated as suitable and can be accomplished immediately following the formation of the crystalline semiconductor material 230 shown in FIG. 1E. Polishing back the top portion 231 allows for better control of the diffusions from the insulating layer 220 into the crystalline semiconductor material 230 to form the drain extensions 233.

In yet another embodiment, a thin layer (e.g., a thickness of about 25 nm) of undoped silicon dioxide is formed over the source region 205. Referring to FIG. 1E, this layer (not shown) acts as a barrier to undesirable solid phase diffusion from the insulating layer 210, (the dopant source), down through the source region 205 and then up into the crystalline semiconductor material 230.

It is also feasible to construct a polysilicon-oxide-polysilicon (POP) capacitor in conjunction with the fabrication of vertical MOSFET devices. The area utilized for the POP capacitor is significantly smaller than conventional capacitors fabricated on an integrated circuit. Also, the ratio of the capacitor surface area to the chip area for a POP capacitor constructed according to the teaching of the present invention is generally greater than the same ratio for the MNP or PNP capacitors described above. Like the vertical replacement gate MOSFETs described herein, the POP capacitor offers a higher circuit density.

An embodiment of the process for fabricating the VRG MOSFETs and the polysilicon-oxide-polysilicon capacitors is illustrated with reference to FIGS. 2A through 2V. The various semiconductor features and regions described therein are preferably composed of silicon, but it is known to those skilled in the art that other embodiments of the invention may be based on other semiconductor materials (including compound or heterojunction semiconductors) alone or in combination. With references to FIGS. 2A through 2V, fabrication of the vertical MOSFET device is illustrated in the left portion of the figures and fabrication of the capacitor is illustrated in the right portion of the Figures, although the claims of the present invention are not limited to the formation of a MOSFET device adjacent a POP capacitor.

Referring to FIG. 2A, a heavily doped source region 305 is formed along a major surface 306 in a silicon substrate 300, preferably a substrate having a <100> crystal orientation. In this embodiment, of a vertical MOSFET, the source region of the device is formed in the silicon substrate and the drain region is formed atop a subsequently formed vertical channel, as will be discussed further hereinbelow. In an alternative embodiment, the drain region is formed in the substrate and the source region is formed atop the vertical channel. The former embodiment is the subject of this description. However, from this description, one skilled in the art can easily form a device in which the drain region is formed in the silicon substrate and the source region is formed overlying the subsequently formed vertical channel.

The depth of the heavily doped source region 305, the concentration of the dopant therein and the type of dopant (e.g., n-type or p-type) are all matters of design choice. An exemplary source region 305, wherein the dopant is phosphorous (P), arsenic (As), antimony (Sb) or boron (B) has a dopant concentration in the range of about $1 \times 10^{19}$ atoms/cm$^3$ to about $5 \times 10^{20}$ atoms/cm$^3$. Depths of the source region 305 and the substrate 300 less than about 300 nm are contemplated as suitable.

Figure 2B:
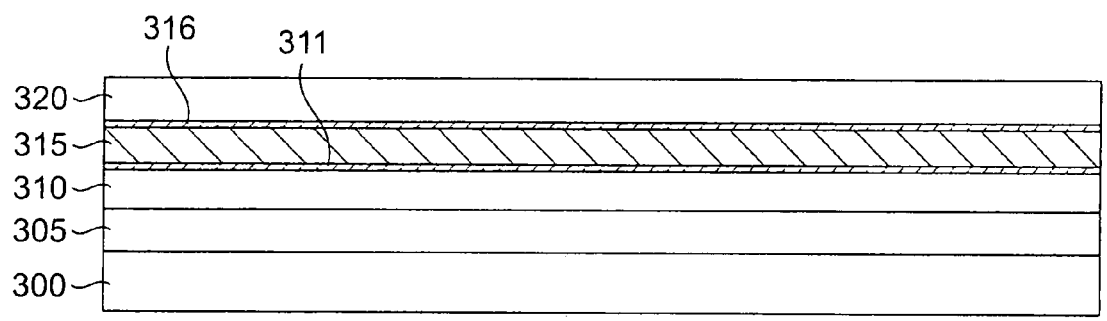

In FIG. 2B, five layers of material 310, 311, 315, 316 and 320 are formed over the source region 305 in the silicon substrate 300. The insulating layer 310 electrically isolates the source region 305 from what will eventually be the overlying gate electrode. Thus, the insulating layer 310 is composed of a material and has a thickness that is consistent with this insulating objective. Examples of suitable materials include doped silicon dioxide. The use of doped insulating layer is advantageous because in certain embodiments, the insulating layer 310 serves as a dopant source, as will be explained further hereinbelow to form source/drain extension regions within the channel region of the device through a solid phase diffusion process. One example of a silicon oxide doping source is PSG (phospho-silicate glass, i.e., a phosphorous-doped silicon oxide) or BSG (boro-silicate glass, i.e., a boron-doped silicon oxide). One skilled in the art is aware of suitable expedients for forming a layer of PSG or BSG on a substrate, e.g., plasma-enhanced chemical vapor deposition (PECVD). Suitable thicknesses for the insulating layer 310 are in the range of about 25 nm to about 350 nm.

An etch stop layer 311 is formed over the insulating layer 310. An etch stop, as is known to those skilled in the art, is designed to prevent an etch expedient from proceeding to an underlying or overlaying layer or layers. The etch stop therefore, has a significantly greater etch resistance to a selected etchant than the adjacent layer or layers that are to be removed. Specifically in this case, for the selected etchant, the etch rate of the etch stop layer 311 is much slower than the etch rate of the overlying layer 315, which, as discussed below, is a sacrificial layer. One skilled in the art is aware that the selection of the material for an etch stop layer is determined by the particular etch expedient used to etch the overlying/underlying layers. In the process of the present invention, wherein the overlying layer is undoped silicon dioxide (e.g., silicon dioxide formed from tetraethylene ortho silicate (TEOS)), an etch stop material that effectively stops etchants for undoped silicon dioxide from penetrating to the layers beneath the etch stop layer 311 is selected. Silicon nitride (Si$_3$N$_4$) is contemplated as a suitable etch stop material. The thickness of the etch stop material layer is also dependent on the resistance of the etch stop material to the selected etchant, relative to the material depth to be removed through the etch process. That is, to be an effective etch stop, the etchant cannot penetrate the etch stop layer in the time required to perform the etching of the layer to be removed.

The etch stop layer 311 also functions as an offset spacer, where the thickness of the offset spacer is determined by the thickness of the etch stop layer 311. In the context of the present invention, the offset spacer controls the position of the junction of the source/drain extensions and the channel, relative to the gate of the device. Specifically, the presence of the offset spacer prevents the source/drain extensions from extending as far under the gate as they otherwise would extend if the offset spacer was not present. One skilled in the art is aware that the farther the source/drain extensions extend under the gate, the greater probability of adverse consequences on device performance, i.e., the gate/source and gate/drain overlap capacitances increase. One skilled in the art will also appreciate that the offset spacer cannot be so thick so as to create a series resistance between the source/drain extensions and the inversion layer formed in the channel under the gate, as such a series would also cause unacceptable device performance. The etch stop layer 311 performs the offset spacer function by its presence between the insulating layer 310 and the sacrificial layer 315 when the insulating layer 310 serves as a source for dopants. For a given vertical diffusion distance by the dopants from the insulating layer 310, the degree of overlap between the source/drain extension and the gate can be controlled precisely through the thickness of the etch stop layer 311, together with control over the dopant diffusion rates.

A sacrificial layer 315 is formed over the etch stop layer 311. The material of the sacrificial layer 315 has a significantly different etch resistance to the selected etchant than the etch stop layer 311. Specifically, for the selected etchant, the etch rate of the sacrificial layer 315 is much higher than the etch rate of the etch stop layer 311. The thickness of the sacrificial layer 315 is selected to correspond to the gate length of the final device, as the sacrificial layer 315 will be removed and the gate of the device formed in the vacated space. Silicon dioxide is an example of a suitable material for the sacrificial layer 315. The sacrificial layer 315 can be formed through a TEOS process.

An etch stop layer 316 is formed over the sacrificial layer 315. The etch stop layer 316 serves the same function as the etch stop layer 311. Therefore, the considerations that govern the selection of the material and thickness for the etch stop layer 311 also govern the selection of the material and thickness for the etch stop layer 316.

An insulating layer 320 is formed over the etch stop layer 316. It is advantageous if the insulating layer 320 has the same etch rate (in the selected etchant) as the insulating layer 310. In fact from the standpoint of processing efficiency, it is advantageous if the material of the insulating layer 310 is the same as the material of the insulating layer 320. In the embodiment where the insulating layer 320 also serves as a dopant source, the insulating layer 320 is PSG or BSG.

Figure 2C:
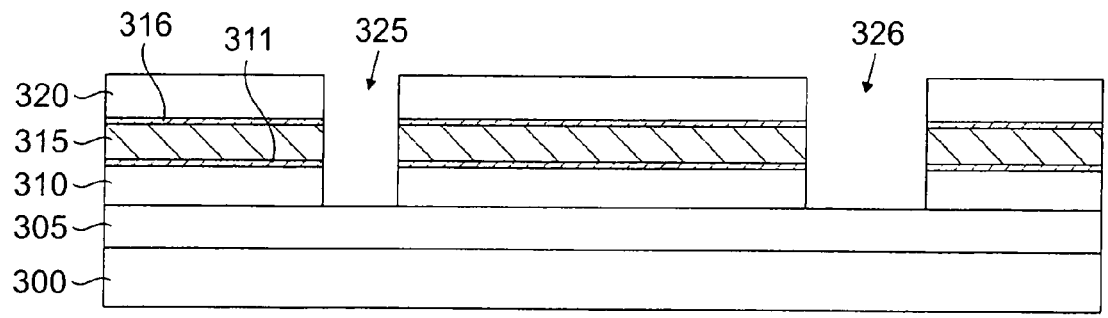

Referring to FIG. 2C, openings, windows or trenches 325 and 326 are etched through the insulating layer 310, the etch stop layer 311, the sacrificial layer 315, the etch stop layer 316 and the insulating layer 320, downwardly to the source region 305. The window horizontal dimension in the FIG. 2C cross-section is determined by the desired device performance characteristics, the size constraints for the device under fabrication and the limitations of the lithographic process utilized to form the windows 325 and 326. The length of the windows 325 and 326, i.e., the length being orthogonal to both the horizontal and vertical dimensions in the FIG. 2C cross-section, is largely a matter of design choice. For a given horizontal dimension, the current capacity of the channel to be formed later in the window 325, increases with increasing window length. The dimensions of the window 326 are determined by the desired capacitance value.

Figure 2D:
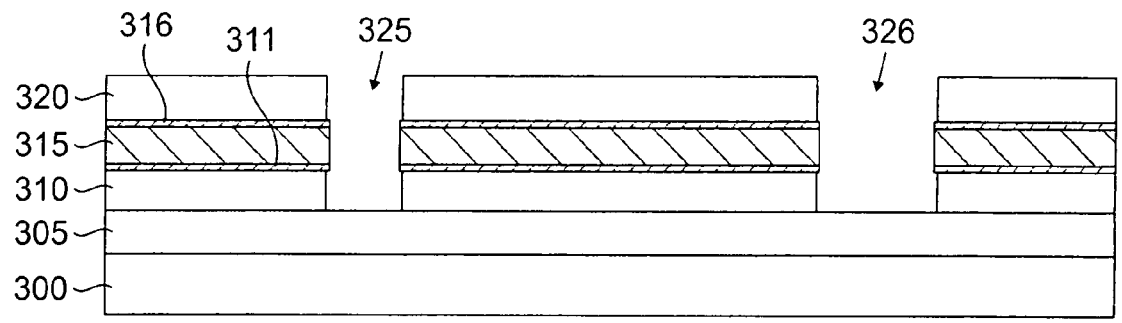

The windows 325 and 326 are then subjected to a chemical cleaning process, (e.g., RCA or piranha-clean) to clean the silicon at the bottom of the windows 325 and 326. As a result of this cleaning step, small portions of the insulating layers 310 and 320 forming a boundary with the windows 325 and 326 are removed. The indentations created are illustrated in FIG. 2D. Thus as shown, the sacrificial layer 315 and the etch stop layers 311 and 316 extend beyond the edge of the insulating layers 310 and 320.

Figure 2E:
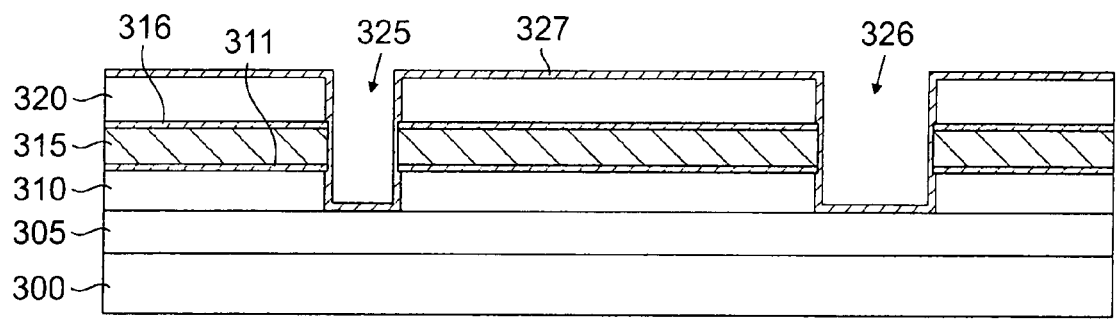

Referring to FIG. 2E, a TEOS layer 327 is deposited over the entire structure. The capacitor region is masked off and the TEOS layer 327 removed (e.g. by conventional etching) from the MOSFET region shown in the left side of the structure.

Figure 2F:
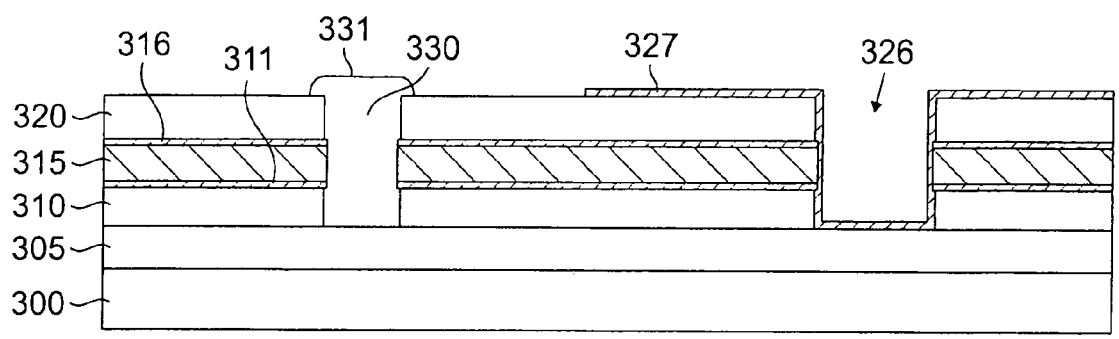

As shown in FIG. 2F, the window 325 is filled with a crystalline semiconductor material 330 (e.g., silicon) including a top portion 331. Other examples of crystalline semiconductor materials that can be utilized includes silicon-germanium and silicon-germanium-carbon. The crystalline semiconductor material 330 may be formed in an undoped or lightly doped state, with completion of the doping process occurring later. Techniques for forming crystalline semiconductor material in a window are well known to one skilled in the art. For example, the crystalline semiconductor material can be formed in the window 325 by epitaxial growth from the source region 305 to form device-quality silicon material. In another embodiment, amorphous silicon can be deposited over the entire substrate 300 and all but the crystalline semiconductor material 330 and a top portion 331 is removed. The amorphous semiconductor material is then annealed to re-crystallize it. In yet another embodiment the top portion 331 is removed by chemical/mechanical polishing of the exposed surface immediately after formation of the crystalline semiconductor material.

The crystalline semiconductor material 330 formed in the window 325 must be doped to form the device channel, as well as the source and drain extensions. Dopants of one type (i.e., n-type or p-type) are introduced into the crystalline semiconductor material 330 to form the channel. A variety of techniques to dope the crystalline semiconductor material 330 are contemplated as suitable. In-situ doping of the crystalline semiconductor material 330 during formation or implantation of dopants into the crystalline semiconductor material 330 after formation, are contemplated as suitable processes. Dopants can be diffused from the source region 335 into the bottom of the crystalline semiconductor material 330 to form the source/drain extensions or they can be formed through solid phase diffusion from an adjacent doped layer, such as the doped insulating layers 310 and 320. As discussed above, the solid phase diffusion step can be executed at several different points in the fabrication process according to the present invention.

Preferably, after the crystalline semiconductor material 330 is doped and the dopants distributed therein in the desired manner, the device should not be subjected to conditions that can significantly affect the dopant distribution in the crystalline semiconductor material 330. Consequently, with this approach after this step, the substrate is not exposed to temperatures that exceed 1100.degree. C. In fact, it is advantageous if the substrate will not be exposed to temperatures in excess of 1000.degree. C. after this point in the process. In certain embodiments, the substrate is not exposed to temperatures that exceed 900.degree. C. for prolonged periods of time (e.g. in excess of several minutes). However, the substrate can be subjected to rapid thermal annealing (at temperatures of about 1000.degree. C.) without adversely affecting the distribution of the dopants in the crystalline semiconductor material 330.

Figure 2G:
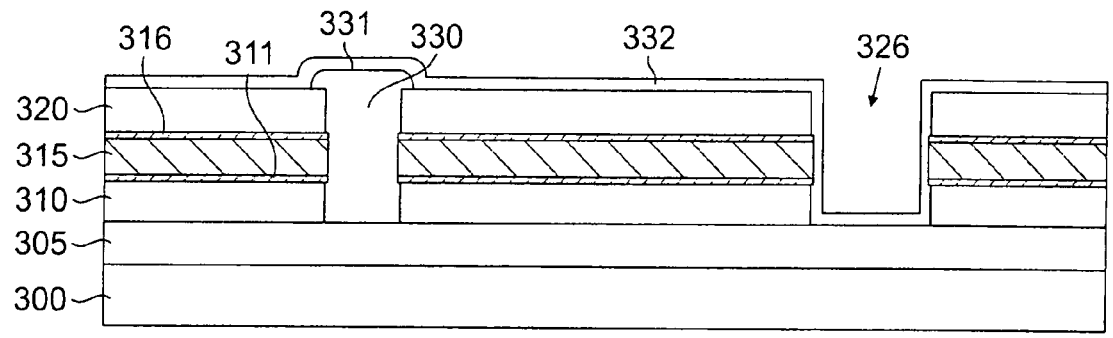

The next several fabrication steps focus on fabrication of the POP capacitor. However, it is known by those skilled in the art that these fabrication steps can be inserted at other points in the VRG fabrication process. The TEOS layer 327 is removed by masking and etching and, as shown in FIG. 2G, a doped polysilicon layer 332 is formed over the structure, including in the window 326. In the region of the MOSFET, the doped polysilicon will form either a source or a drain region for the device; in the region of the POP capacitor, the polysilicon layer 332 forms one plate of the capacitor. More generally, the layer 332 must be conductive and thus, a metal or metal-containing material may be used in lieu of doped polysilicon for the material of the layer 332.

Figure 2H:
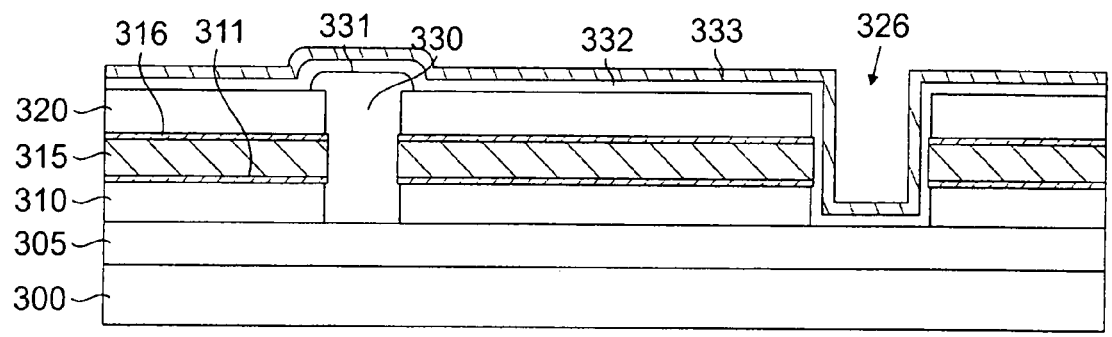
Figure 2I:
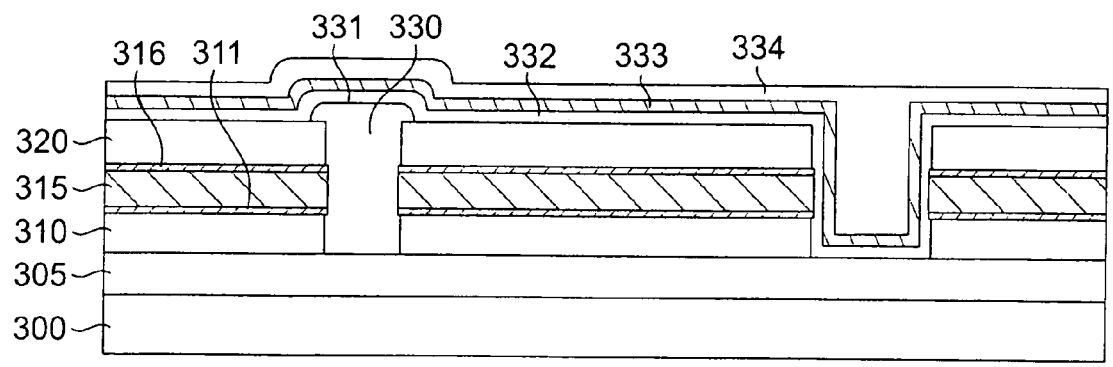
Figure 2J:
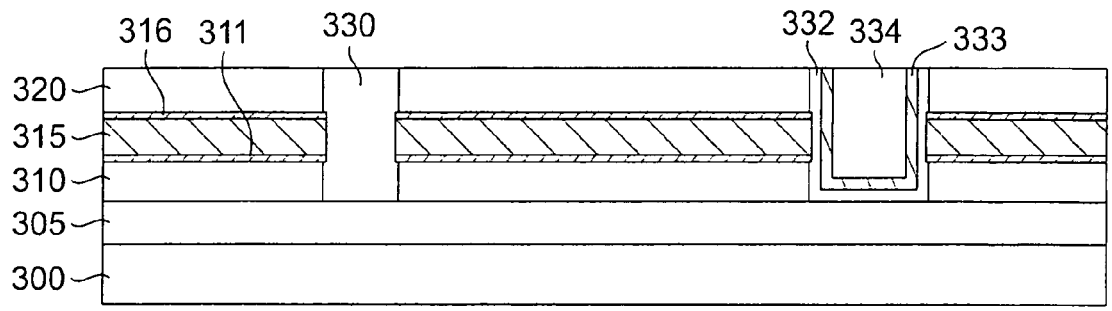

In the fabrication step represented in FIG. 2H, a layer of silicon dioxide 333 is conformally deposited over the polycrystalline layer 332. Referring to FIG. 2I, a doped polysilicon layer 334 is deposited over the entire structure, including filling the remaining void in the capacitor window 326. After a chemical-mechanical polishing step, the structure appears as in FIG. 2J, with the oxide layer 333 disposed between the polysilicon layers 332 and 334, forming a polysilicon-oxide-polysilicon (POP) capacitor in the window 326. At this point, the crystalline semiconductor material 330 for the MOSFET remains in the window 325.

Figure 2K:
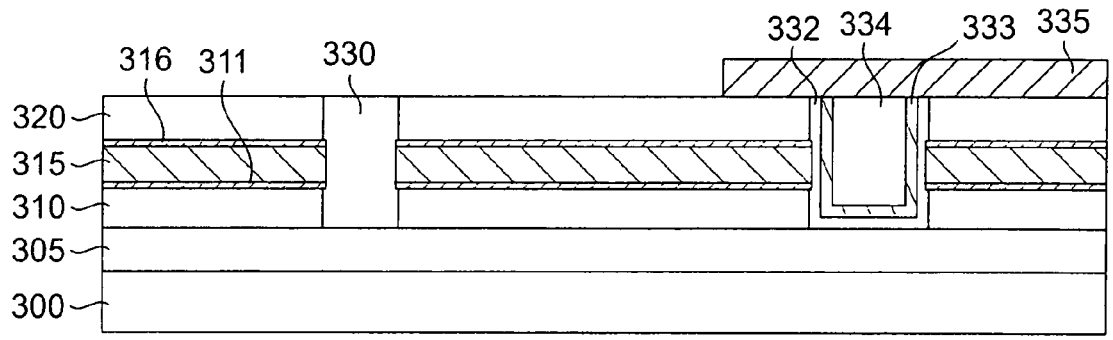

The MOSFET is masked, and as shown in FIG. 2K, a layer of silicon nitride 335 is deposited over the capacitor window 326 to isolate the POP capacitor from additional fabrication steps that could short the polysilicon layers 332 and 334. Vias will be formed later in the silicon nitride layer 335 to access the capacitor plates. The polysilicon layer 331, forming the second plate of the POP capacitor may also be accessed in the third dimension, outside the plane of the FIG. 2K cross-section. Because the POP capacitor is created in a trench of the semiconductor substrate 300, the ratio of the surface area of the capacitor to the chip area occupied by the capacitor is much greater than this ratio for the MNP or PNP capacitors discussed above and for the, prior art integrated circuit capacitors. Thus, in terms of area utilization, the POP capacitor is a more efficient device.

Figure 2L:
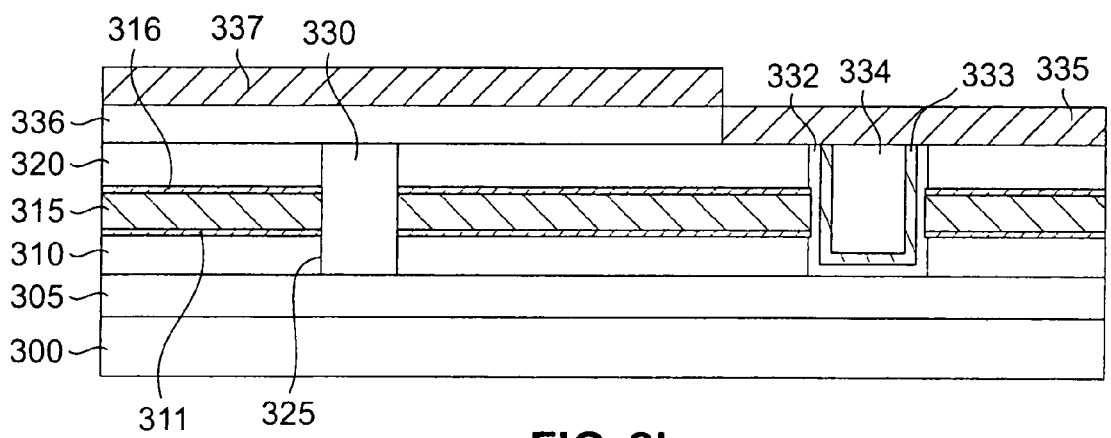

At this point in the exemplary fabrication process, processing returns to the VRG MOSFET device, beginning with FIG. 2L. The POP capacitor is masked such that it is unaffected by the following VRG MOSFET process steps. A conformal drain layer 336 is formed over the insulating layer 320. The drain layer 336 provides a self-aligned top contact (the drain contact in this embodiment). One example of the suitable material for the drain layer 336 is doped polycrystalline silicon. The selected dopant is opposite in type to that used to dope the silicon channel. The concentration of the dopant in the drain layer 336 is greater than about 1.times.10.sup.20 atoms/cm.sup.3.

As further illustrated in FIG. 2L, a conformal layer 337 is deposited over the drain layer 336. The material selected for the layer 337 has an etch rate that is significantly slower than the etch rate of the sacrificial layer 315, based on the etchant selected to remove the sacrificial layer 315. It is advantageous if the material selected for the layer 337 is the same as the material of the etch stop layers 311 and 316. One example of suitable material is silicon nitride.

Figure 2M:
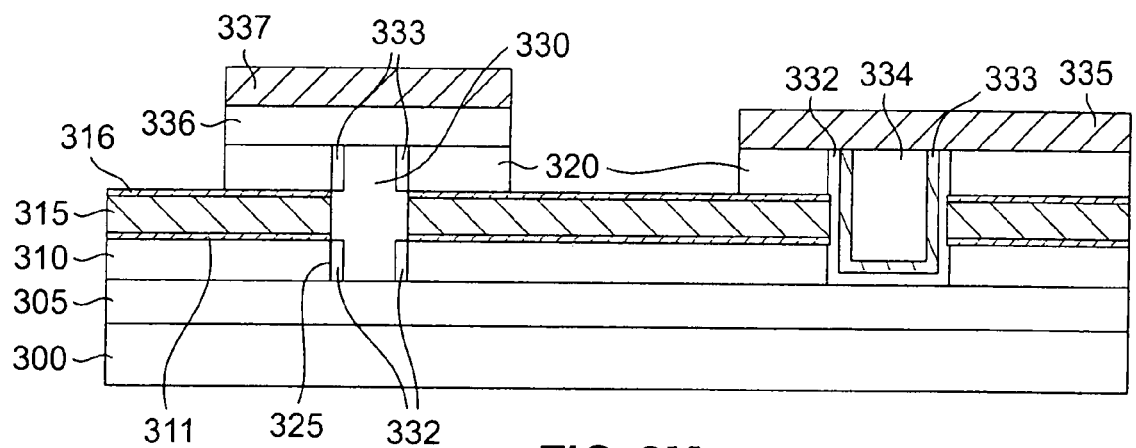

As shown in FIG. 2M, using conventional lithographic techniques the drain layer 336, the layer 337, and the insulation layer 320 are patterned (using one or more dry etch steps) so that only those portions overlying or adjacent the crystalline semiconductor material 330 remain.

In one embodiment, the solid phase diffusion step is performed at this point in the process to form the source/drain extensions 332 and 333.

Figure 2N:
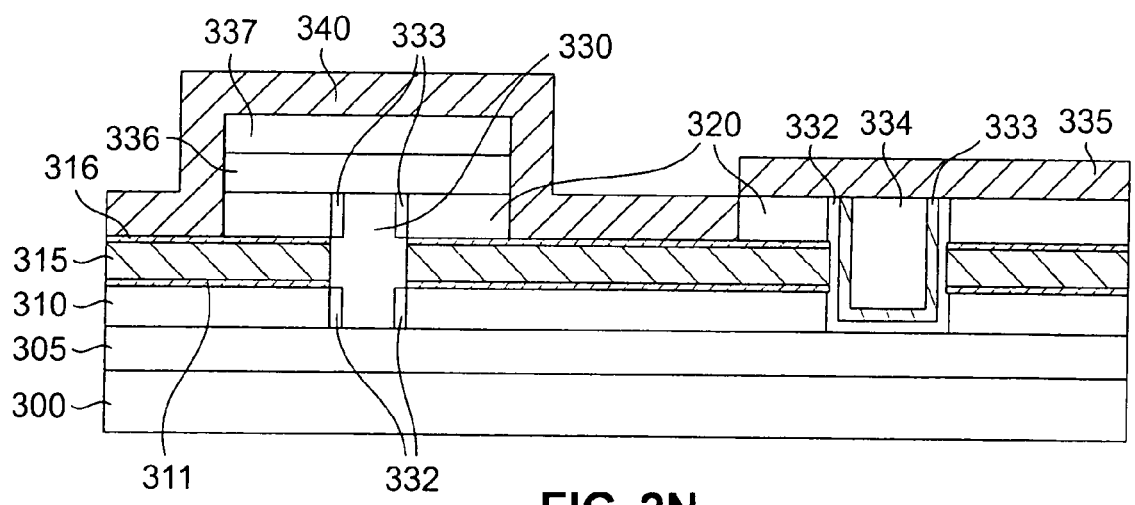

As illustrated in FIG. 2N, a conformal layer 340 is then deposited over the MOSFET region of the structure. The material for layer 340 is, selected to have an etch rate that is significantly slower than the etch rate of the sacrificial layer 315, in the etchant selected to remove the sacrificial layer 315. One example of a suitable material for the layer 340 is silicon nitride. The thickness of the layer 340 is selected so that the remaining portions of the drain layer 336, the layer 337 and the insulating layer 320 are protected from contact with subsequent etchants.

Figure 2O:
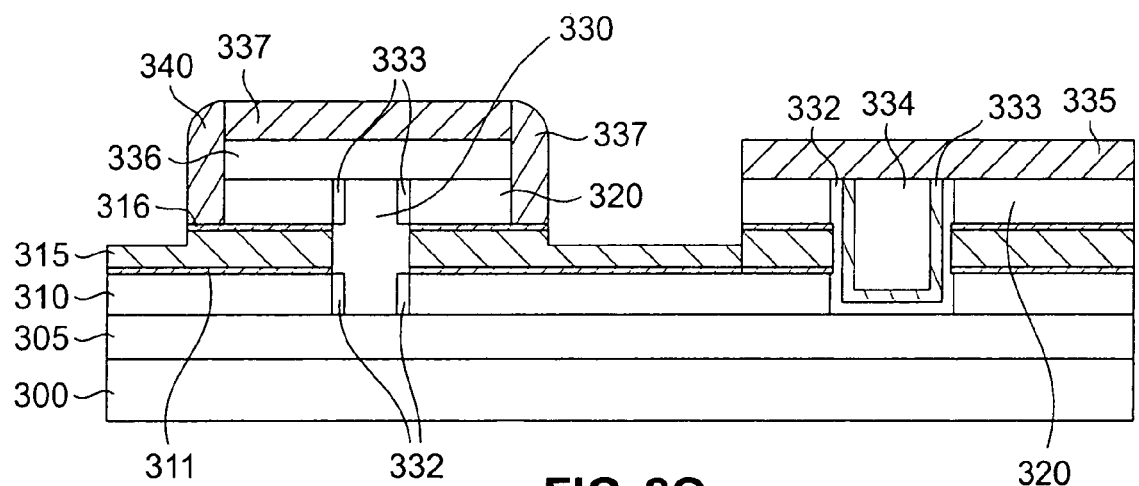

The layer 340 is then etched using an anisotropic etch such as dry plasma etch, which also removes a portion of the etch stop layer 316. As is known to those skilled in the art, an anisotropic etch material etches vertically, but not laterally along the surface. As shown in FIG. 2O, the only portion of the layer 340 that remains after the anisotropic etch is that portion laterally adjacent to the stack of the insulating layer 320 and the drain layer 336 and the layer 337. The sacrificial layer 315 is now exposed and also reduced somewhat in the vertical dimension.

Figure 2P:
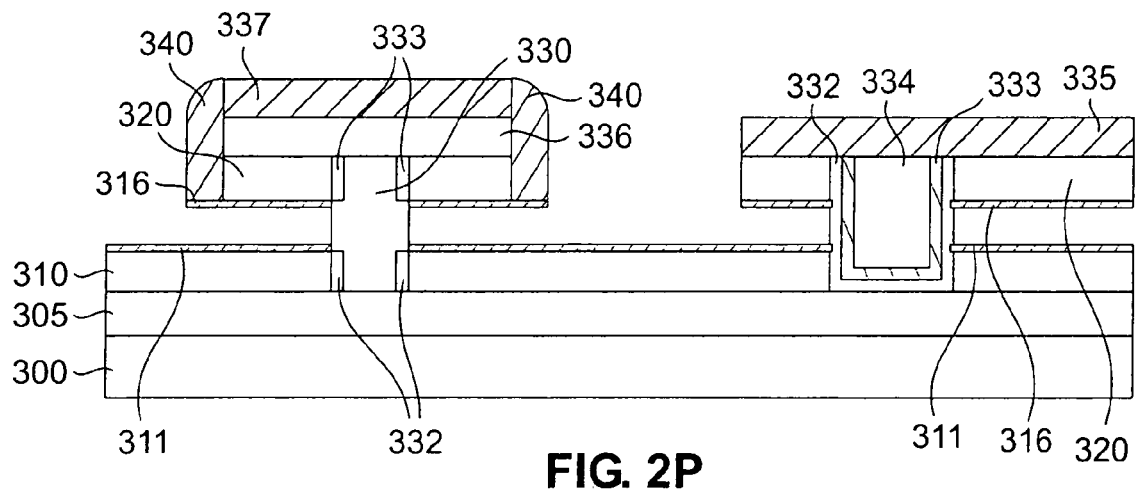

The mask is now removed from the POP capacitor region and the entire substrate is subjected to a wet etch (e.g., an aqueous hydrofluoric acid) or an isotropic dry etch (e.g., an anhydrous hydrofluoric acid), which removes the remaining portion of the sacrificial layer 315 in both the MOSFET region and in the POP capacitor region. The result is illustrated in FIG. 2P. The insulating layer 310 is still covered by the etch stop layer 311, and the exposed portion of the etch stop layer 316 and the layers 337 and 340 encapsulate the insulating layer 320 and the drain layer 336, so that these layers remain isolated from contact with subsequent etch expedients. Also the etch stop layer 316 protects the overlying insulator layer 320 in the POP capacitor region. The exposed portion of the crystalline semiconductor material 330 corresponds to the thickness of the sacrificial layer 315 and defines the physical channel length of the MOSFET device.

Figure 2Q:
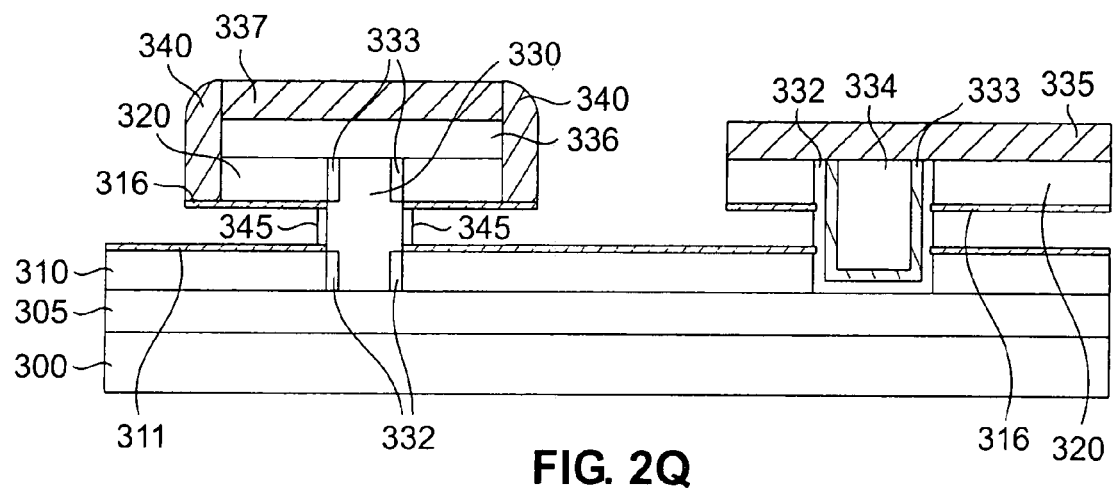
Figure 2R:
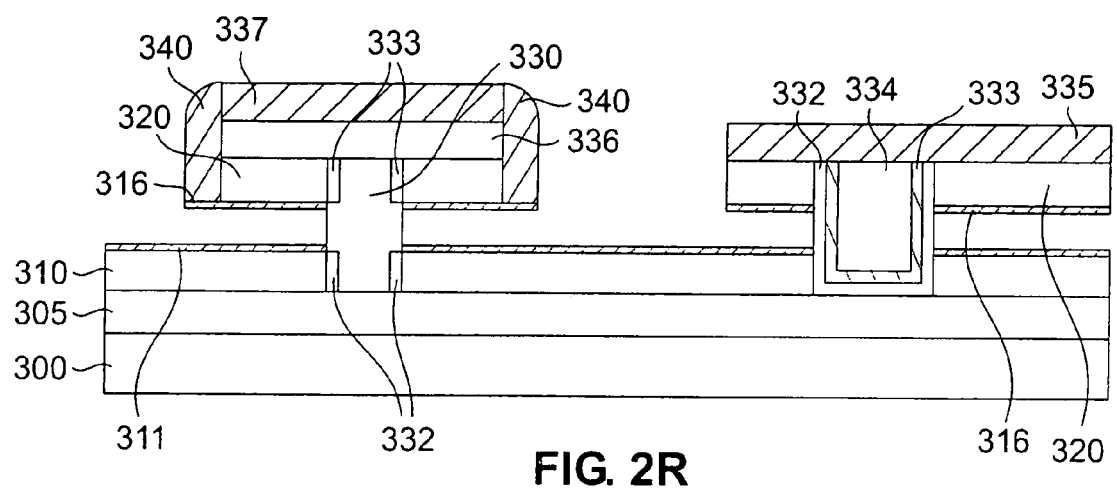

The POP capacitor region is masked again and as shown in FIG. 2Q, a sacrificial layer of thermal silicon dioxide 345 is grown on the exposed surface of the crystalline semiconductor material 330 in the MOSFET region. A sacrificial silicon dioxide thickness on the order of less than about 10 nm is contemplated as suitable. The sacrificial silicon dioxide 345 is then removed (see FIG. 2R) using a conventional isotropic etch (e.g. an aqueous hydrofluoric acid). As a result of the formation and then the removal of the sacrificial silicon dioxide 345, the surface of the crystalline semiconductor material 330 is smoother and some of the side wall defects are removed. This step is not required according to the present invention, but may be advantageous if there are excessive defects in the crystalline semiconductor material 330. The etch stop layers 311 and 316 prevent the expedient from contacting the insulating layers 310 and 320 and the drain layer 336 during this process step.

Figure 2S:
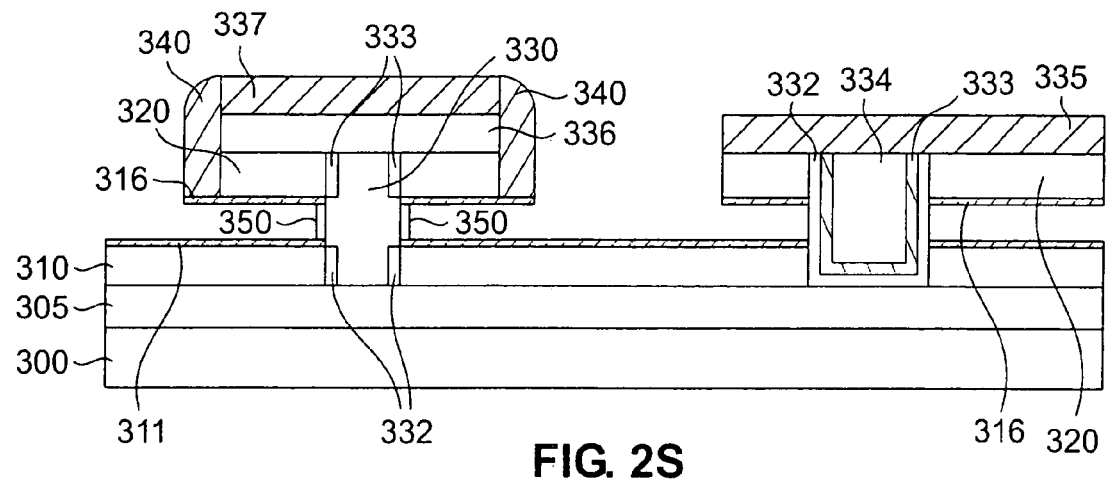

As shown in FIG. 2S, a layer of gate dielectric 350 (or gate oxide) is formed on the exposed portion of the crystalline semiconductor material 330. Suitable dielectric materials include, for example, silicon dioxide, silicon oxynitride, silicon nitride or metal oxide. The thickness of the gate dielectric 350 is about 1 nm to about 30 nm. One example of a suitable thickness is 6 nm. In one embodiment, the silicon dioxide layer is formed by heating the substrate to a temperature in a range of about 700.degree. C. to about 1000.degree. C. in an oxygen-containing atmosphere. Other expedients for forming the gate dielectric include chemical vapor deposition, jet vapor deposition or atomic layer deposition, all of which are contemplated as suitable. Conditions for forming the gate dielectric 350 of the desired thickness are well known to those skilled in the art.

Figure 2T:
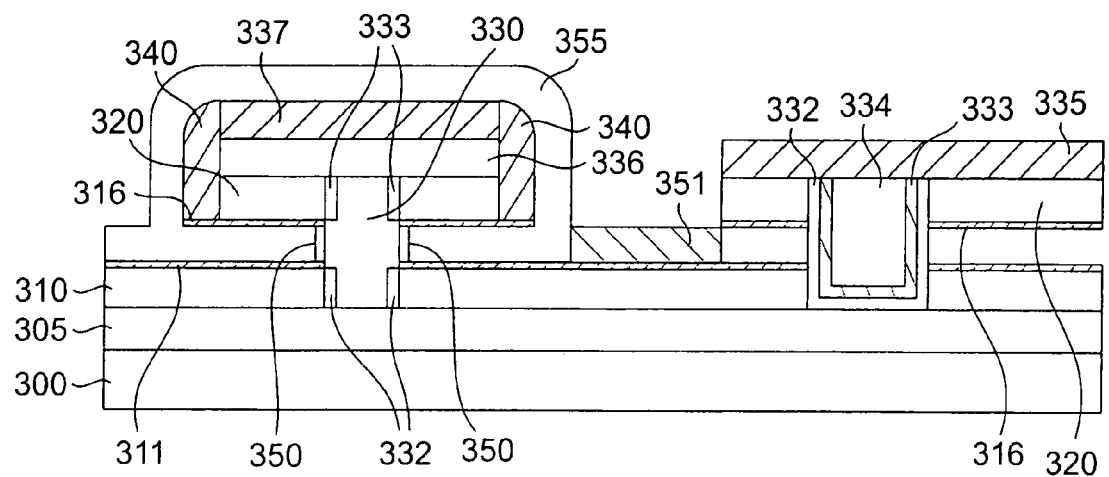

Referring to FIG. 2T, a gate electrode is formed by depositing a gate electrode layer 355 of sufficiently conformal and suitable gate material, e.g., a layer of doped amorphous silicon in which the dopant is introduced in situ and then subsequently re-crystallized to form polycrystalline silicon. As mentioned above, this must be accomplished using conditions that do not significantly affect the dopant profiles of the dopants in the crystalline semiconductor material 330. Other examples of suitable gate electrode materials include polycrystalline silicon, silicon-germanium and silicon-germanium-carbon. Metals and metal-containing compounds that have a suitably low resistivity and are compatible with the gate dielectric material and the other semiconductor processing steps, are also contemplated as suitable gate electrode materials. For CMOS applications, it is advantageous if the gate material has a work function approximately near the middle of the band gap of the crystalline semiconductor material 330. Examples of such metals include titanium, titanium nitride, tungsten, tungsten silicide, tantalum, tantalum nitride and molybdenum. Suitable expedients for forming the gate electrode material include chemical vapor deposition, electroplating and combinations thereof.

According to the structure illustrated in FIG. 2T, the MOSFET gate is connected to one plate of the POP capacitor by way of the gate electrode layer 355. Although this may be desirable in some circuit configurations, in those where it is not, an insulative layer, for example a silicon dioxide trench, may be formed to isolate that portion of the gate electrode layer 355 adjacent the polysilicon layer 332 of the POP capacitor from that adjacent the gate dielectric 350 of the MOSFET device. Such a trench 351 is illustrated in FIG. 2T. Those skilled in the art are familiar with the process for forming such a trench. Alternatively, the segment of the gate electrode layer bridging the MOSFET gate and the POP capacitor plate can be removed by patterning and etching.

Figure 2U:
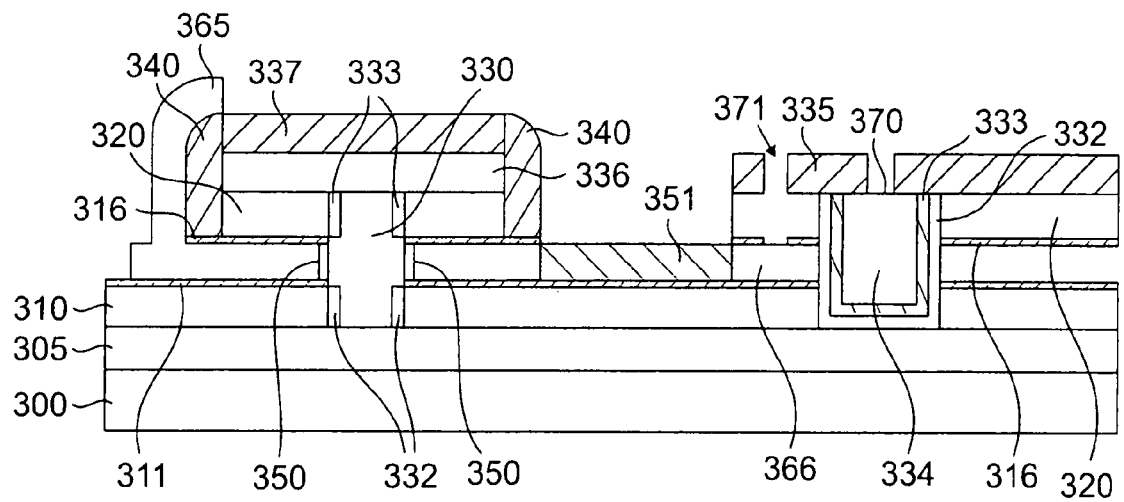

Referring to FIG. 2U, the gate electrode layer 355 is patterned (which is a matter of design choice) to form a gate 365 of the MOSFET device. The gate electrode layer 355 in the POP capacitor region bears reference character 366. The gate 365 surrounds the crystalline semiconductor material 330 and the gate oxide 350 formed thereon. A window 370 is etched in the capacitor nitride layer 335 to access the polysilicon, which serves as one capacitor plate. The polysilicon layer 382, forming the other capacitor plate, is accessed by a via 371 formed in both silicon nitride layers 316 and 335.

Figure 2V:
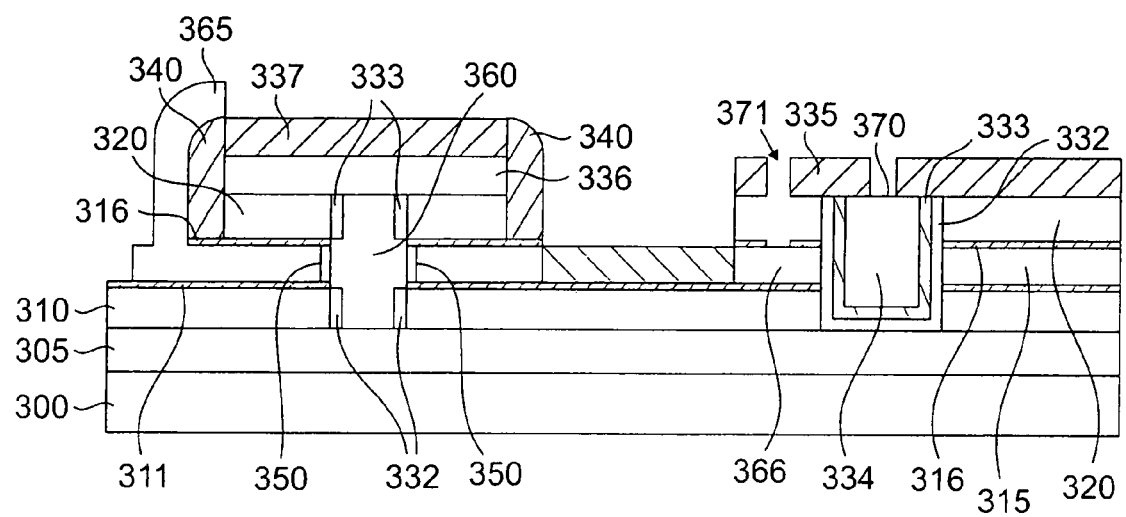

FIG. 2V shows the finished MOSFET and POP capacitor devices. If not executed earlier in the process, the dopants are now driven into the crystalline semiconductor material 330 by solid phase diffusion from the insulating layers 310 and 320 to form the source/drain extensions 332 and drain.

Figure 2W:
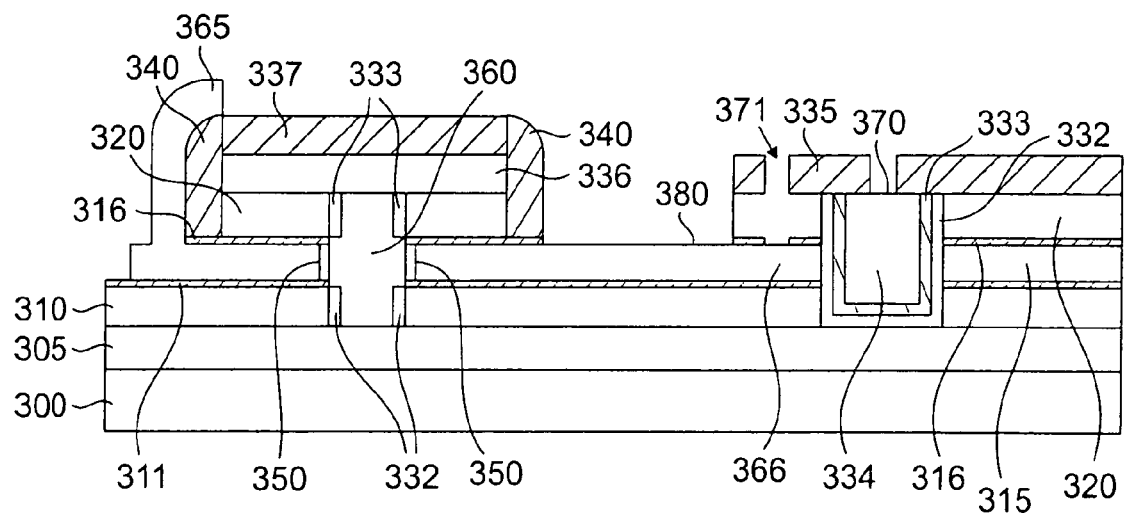

In yet another embodiment, a conductor 380 illustrated in FIG. 2W connects the gate 365 to the capacitor plate 332.

In yet another embodiment of the present invention, a thin layer (e.g., a thickness of about 25 nm) of undoped silicon dioxide is formed over the source layer 305. Referring to FIG. 2E, this layer (not shown) acts as a barriers to undesirable solid phase diffusion from the insulating layer 310, (the dopant source), down through the source layer 305 and then up into the crystalline semiconductor material 330.

An architecture and process have been described for providing various capacitor structures on an integrated circuit, especially an integrated circuit comprising one or more vertical replacement gate MOSFETS. While specific applications of the invention have been illustrated, the principals disclosed herein provide a basis for practicing the invention in a variety of ways and in a variety of circuit structures, including circuit structures formed with Group III-IV compounds and other semiconductor materials. Although the exemplary embodiments pertain to vertical replacement gate CMOSFETs, numerous variations are contemplated. These includes structures comprising vertical bipolar transistor devices, diodes and, more generally, diffusion regions in conjunction with the capacitor architectures described herein. Still other constructions not expressly identified herein do not depart from the scope of the invention, which is limited only by the claims that follow.

The invention claimed is:

1. A process for fabricating an integrated circuit structure comprising:
    forming a first device region selected from the group consisting of a source region and a drain region of a semiconductor device in a semiconductor substrate;
    forming a multilayer stack comprising at least three layers of material over the first device region in the semiconductor substrate, wherein the second layer is interposed between the first and the third layers, and wherein the first layer is adjacent the first device region;
    forming a window in the at least three layers of material, wherein the window terminates at the first device region formed;
    forming a doped semiconductor plug in the window, wherein the semiconductor plug has a first end and a second end, and wherein the first end is in contact with the first device region;
    forming a second device region selected from the group consisting of a source region and a drain region in the second end of the semiconductor plug, wherein one of the first and second device regions is a source region and the other is a drain region;
    removing the second layer, thereby exposing a portion of the semiconductor plug;
    forming gate dielectric material on the exposed portion of the semiconductor plug;
    forming a conductive layer comprising a horizontal capacitor segment and a vertical gate segment, wherein the vertical gate segment contacts the gate dielectric material to form a gate of a MOSFET device, and the horizontal capacitor segment forms a first capacitor plate;
    forming a capacitor dielectric layer over the first capacitor plate; and
    forming a second capacitor plate over the capacitor dielectric layer.

2. The process of claim 1 wherein the second layer is removed by etching in an etchant, characterized by a first layer etch rate, a second layer etch rate, and a third layer etch rate, and wherein the second layer etch rate is at least ten times faster than one of the first layer etch rate and the third layer etch rate.

3. The process of claim 1 wherein the semiconductor plug comprises a doped crystalline semiconductor material, and wherein the dopant is selected from the group consisting of n-type dopants and p-type dopants, and wherein the crystalline semiconductor material selected from the group consisting of silicon, silicon germanium, and silicon-germanium-carbon.

4. The process of claim 1 further comprising forming a layer of insulating material over either the first layer of material and the second layer of material, or both the first and second layers of material, wherein the layer of insulating material comprises an etch stop layer.

5. The process of claim 4 wherein the material of the first and the third layers comprises a doped insulating material, and wherein source and drain region extensions are formed within the semiconductor plug by the diffusion of dopants from the first and the third layers into the adjacent semiconductor plug material, and wherein the layer of insulating material comprises an offset spacer for controlling the extent of vertical diffusion of dopants from the first and the third layers.

6. The process of claim 1 wherein the substrate is selected from the group comprising silicon substrates and silicon-on-insulator substrates.

7. The process of claim 1 wherein the conductive material is selected from the group consisting of doped polycrystalline silicon, doped amorphous silicon, doped silicon germanium, doped silicon-germanium-carbon, metals and metal compounds.

8. The process of claim 1 further comprising the steps of:
    forming an insulating layer over the second capacitor plate; and
    forming a window in the insulating layer for accessing the second capacitor plate.

9. The process of claim 8 wherein the insulating layer is selected from the group consisting of silicon nitride and silicon dioxide.

10. The process of claim 1 wherein the first and the second capacitor plates are formed of a material selected from the group comprising doped polysilicon, metal, and metal compounds.

11. The process of claim 1 wherein the capacitor dielectric layer is formed of material selected from the group comprising silicon dioxide and silicon nitride.

12. The process of claim 1 further comprising insulating the horizontal and the vertical segments of the conductive layer.

13. The process of claim 12 wherein an insulative trench insulates the horizontal and vertical segments of the conductive layer.

* * * * *